United States Patent
Grossi

(10) Patent No.: US 10,598,714 B2
(45) Date of Patent: Mar. 24, 2020

(54) BATTERY DISCONNECT FOR ELECTRICAL DRAIN TEST SYSTEM

(71) Applicant: Grosch, LLC, Lakewood, CO (US)

(72) Inventor: Briant Grossi, Highlands Ranch, CO (US)

(73) Assignee: Grosch, LLC, Lakewood, CO (US)

(*) Notice: Subject to any disclaimer, the term of this patent is extended or adjusted under 35 U.S.C. 154(b) by 12 days.

(21) Appl. No.: 16/028,780

(22) Filed: Jul. 6, 2018

(65) Prior Publication Data

US 2018/0328970 A1 Nov. 15, 2018

Related U.S. Application Data

(63) Continuation of application No. 14/738,662, filed on Jun. 12, 2015, now Pat. No. 10,041,988.

(Continued)

(51) Int. Cl.
| | |
|---|---|
| *G01R 31/25* | (2006.01) |
| *G01R 31/00* | (2006.01) |
| *G01R 31/327* | (2006.01) |
| *G01R 31/26* | (2020.01) |
| *G01R 31/28* | (2006.01) |
| *G01R 31/50* | (2020.01) |

(52) U.S. Cl.
CPC ........ *G01R 31/007* (2013.01); *G01R 31/2632* (2013.01); *G01R 31/2825* (2013.01); *G01R 31/3277* (2013.01); *G01R 31/50* (2020.01)

(58) Field of Classification Search
CPC .............. G01R 31/389; G01R 31/3842; G01R 31/396; G01R 31/025; G01R 31/382; G01R 31/392; G01R 15/125; G01R 19/145; G01R 19/16542; G01R 31/36; G01R 31/3647
See application file for complete search history.

(56) References Cited

U.S. PATENT DOCUMENTS

| | | |
|---|---|---|
| 5,254,952 A | 10/1993 | Salley et al. |
| 5,367,250 A | 11/1994 | Whisenand |

(Continued)

FOREIGN PATENT DOCUMENTS

WO 2016/0173169 5/2016

OTHER PUBLICATIONS

International Search Report of co-pending patent application PCT/US2015/056050, 3 pages.

(Continued)

*Primary Examiner* — Alesa Allgood

(74) *Attorney, Agent, or Firm* — Trenner Law Firm, LLC; Mark D. Trenner

(57) ABSTRACT

An example electrical drain test device includes a battery interface system having electrical cables to connect in-line with a negative battery post of a battery and an electrical system under test without losing connectivity to test the electrical system under test without having to reset test or vehicle modules. The example electrical drain test device also includes a battery disconnect switch. The battery disconnect switch in a first position provides continuous electrical current between the battery and the electrical system. The battery disconnect switch in a second position electrically connects the electrical system under test to the battery through a test circuit to test the electrical system under test for parasitic drain. After an initial connection, the system under test remains in electrical connection with the battery regardless of switch position.

20 Claims, 19 Drawing Sheets

Related U.S. Application Data

(60) Provisional application No. 62/075,102, filed on Nov. 4, 2014.

(56) References Cited

U.S. PATENT DOCUMENTS

| | | | |
|---|---|---|---|
| 5,629,680 | A | 5/1997 | Makhija |
| 6,459,968 | B1 | 10/2002 | Kochie |
| 8,209,082 | B2 | 6/2012 | Miller |
| 8,818,617 | B2 | 8/2014 | Miller |
| 9,176,567 | B2 | 11/2015 | Lorin et al. |
| 10,041,988 | B2 | 8/2018 | Grossi |
| 2004/0164708 | A1 | 8/2004 | Veselic et al. |
| 2008/0111557 | A1 | 5/2008 | Elder et al. |
| 2012/0323435 | A1 | 12/2012 | Miller et al. |

OTHER PUBLICATIONS

International Preliminary Report on PCT/US2015/056050 with Written Opinion of the International Searching Authority, dated Jan. 26, 2016, 7 pages.

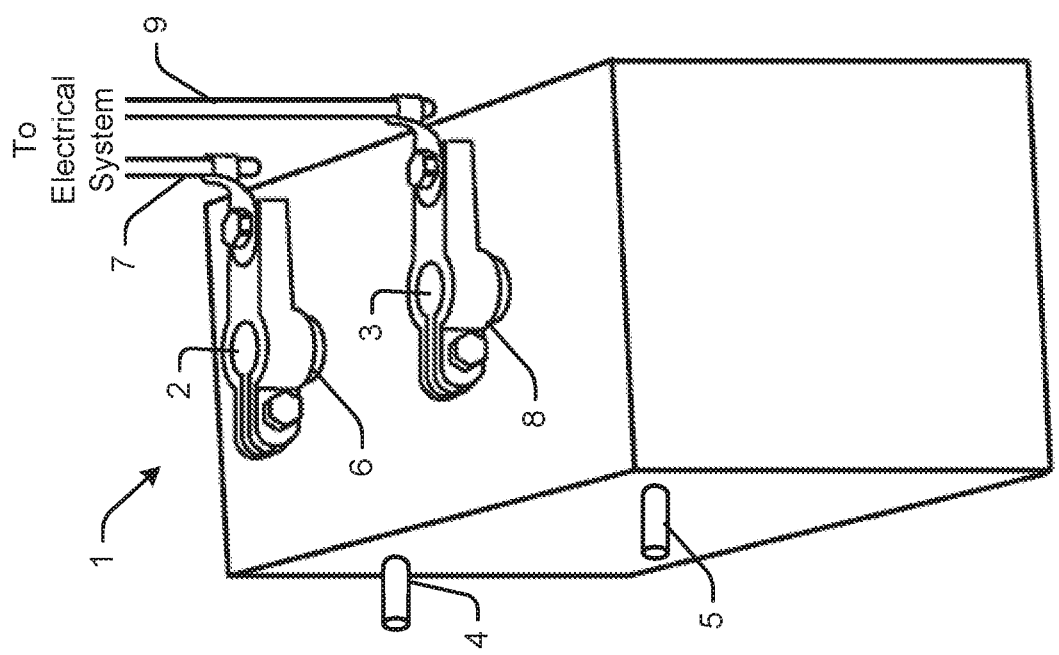

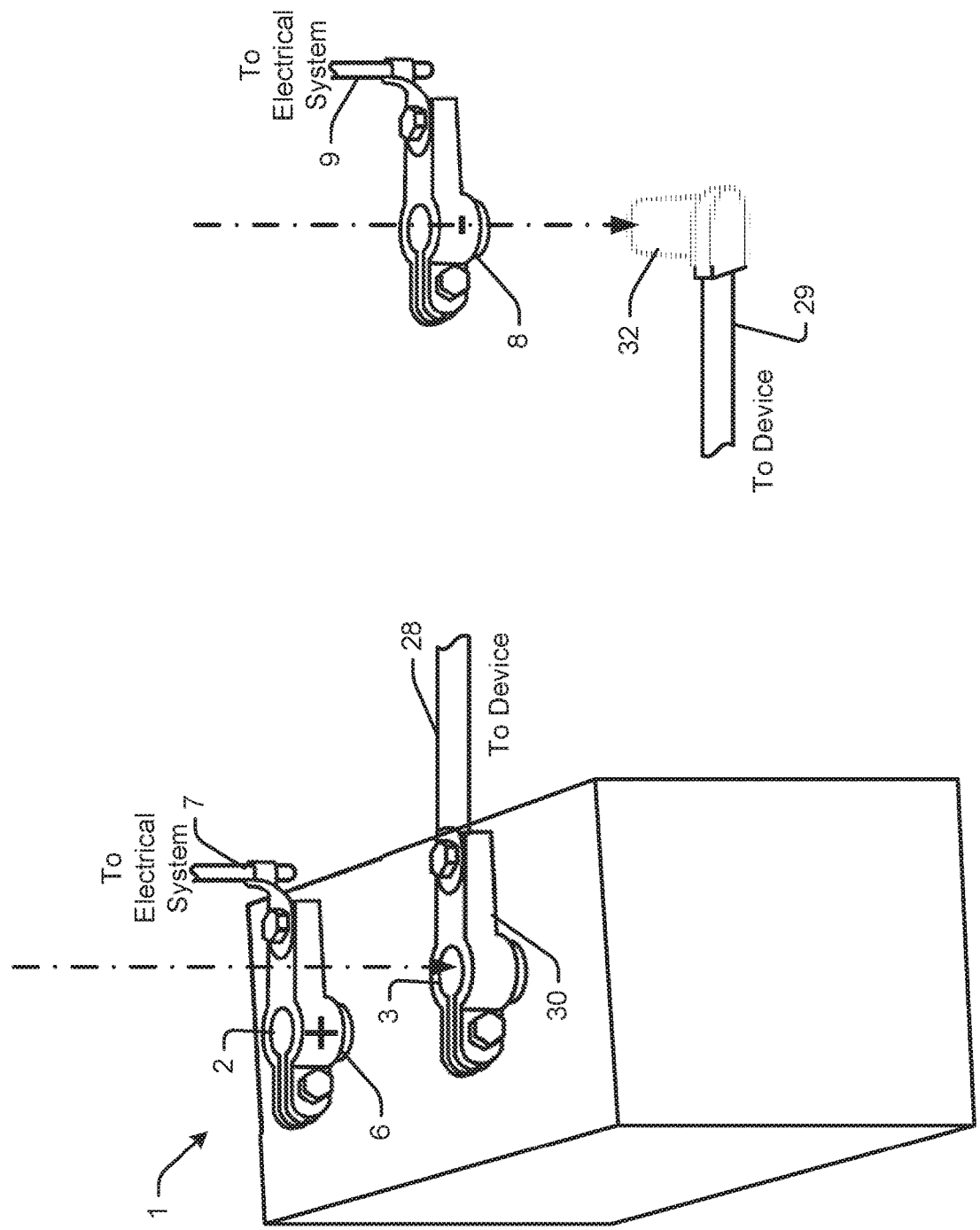

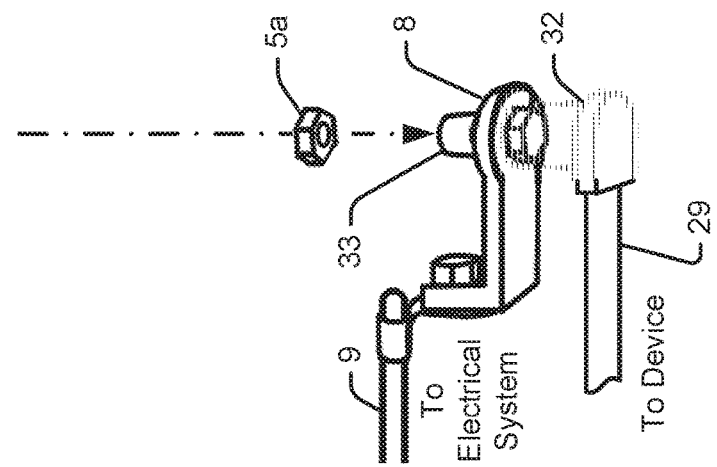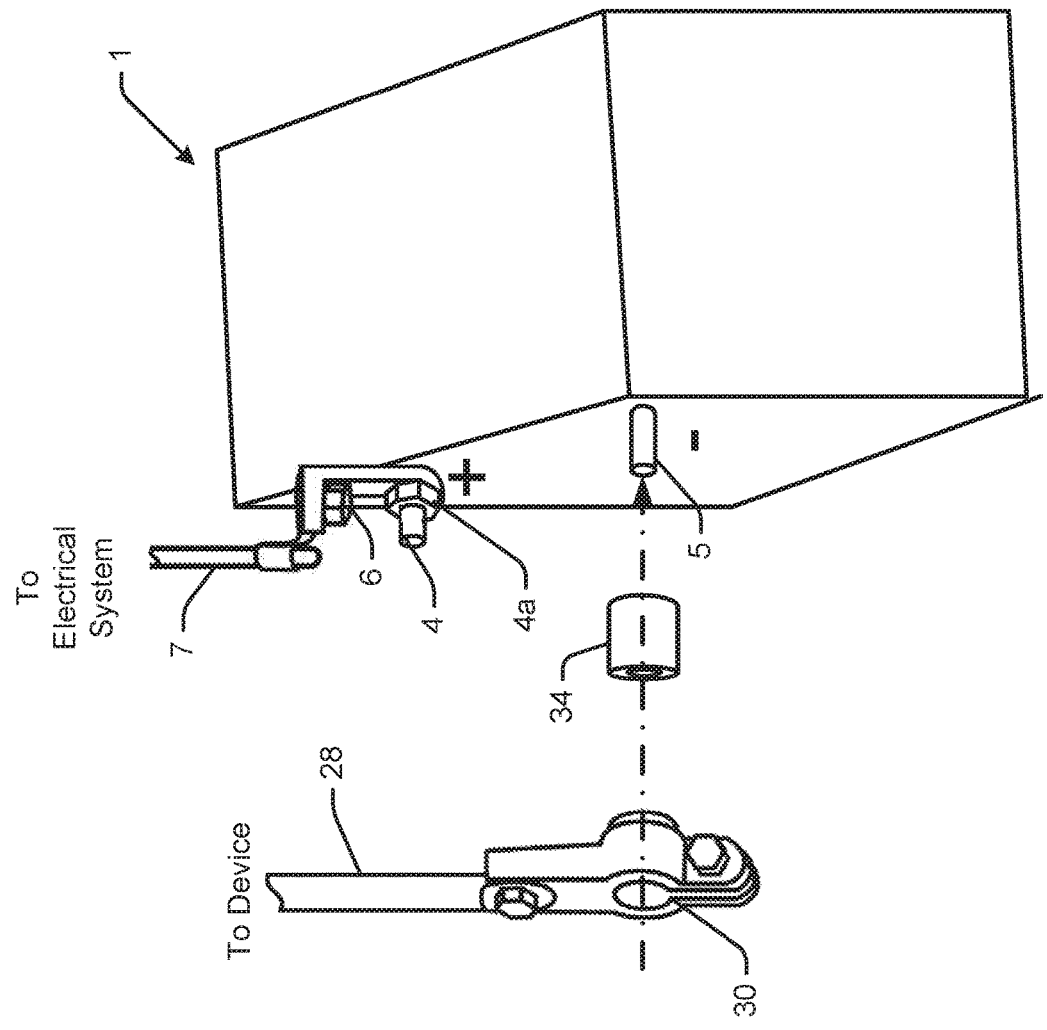
Fig. 4B

BATTERY DISCONNECT FOR ELECTRICAL DRAIN TEST SYSTEM

PRIORITY CLAIM

This application is a continuation of U.S. patent application Ser. No. 14/738,662 filed Jun. 12, 2015 for "Electrical Drain Test System and Method" of Briant Grossi, which claims the priority benefit of U.S. Provisional Patent Application No. 62/075,102 filed Nov. 4, 2014 for "Parasitic Drain Test Apparatus" of Briant Grossi, each of which is incorporated by reference in its entirety as though fully set forth herein.

BACKGROUND

Automotive electrical systems have become increasingly complex, and now include computers and computer modules throughout the vehicle, including for example, engine modules (such as monitors, feedback, body control modules, central timer modules, lighting modules, and other controls), air bag modules, backup sensors (and other driving aids), and so-called "info-tainment" systems (providing both information such as a GPS, and entertainment such as video and/or audio). Some vehicles are equipped with more than one battery. A fault with any one of these modules and/or wiring (e.g., a short) can result in a current draw even when the electrical system is not in an active state, that is, even when the engine is shut off as the vehicle goes into "sleep" mode, and the battery is not being recharged. As such, these faults can result in a dead battery. There is much ambiguity as to which system or component may be the issue, making diagnosing and repairing electrical issues time-consuming, expensive and difficult.

Diagnosing electrical faults has typically been the domain of an experienced technician equipped with an ammeter and a good understanding of the electrical system under test. But most technicians are restricted by the lack of technology in this area and are reduced to using a traditional test light or just pulling fuses to see if the car will start the next day. Even for the experienced professional, testing can be a time-consuming process. Often, specifications can be very difficult to obtain, and in some cases not provided by common information systems. Sometimes, even the experienced professional cannot find the exact cause of the electrical fault, and is thus reduced to replacing components and hoping that the problem is resolved.

BRIEF DESCRIPTION OF THE DRAWINGS

FIGS. 3A-B and 4A-B show a battery illustrating connection of an example electrical drain test device.

DETAILED DESCRIPTION

Figure 1:
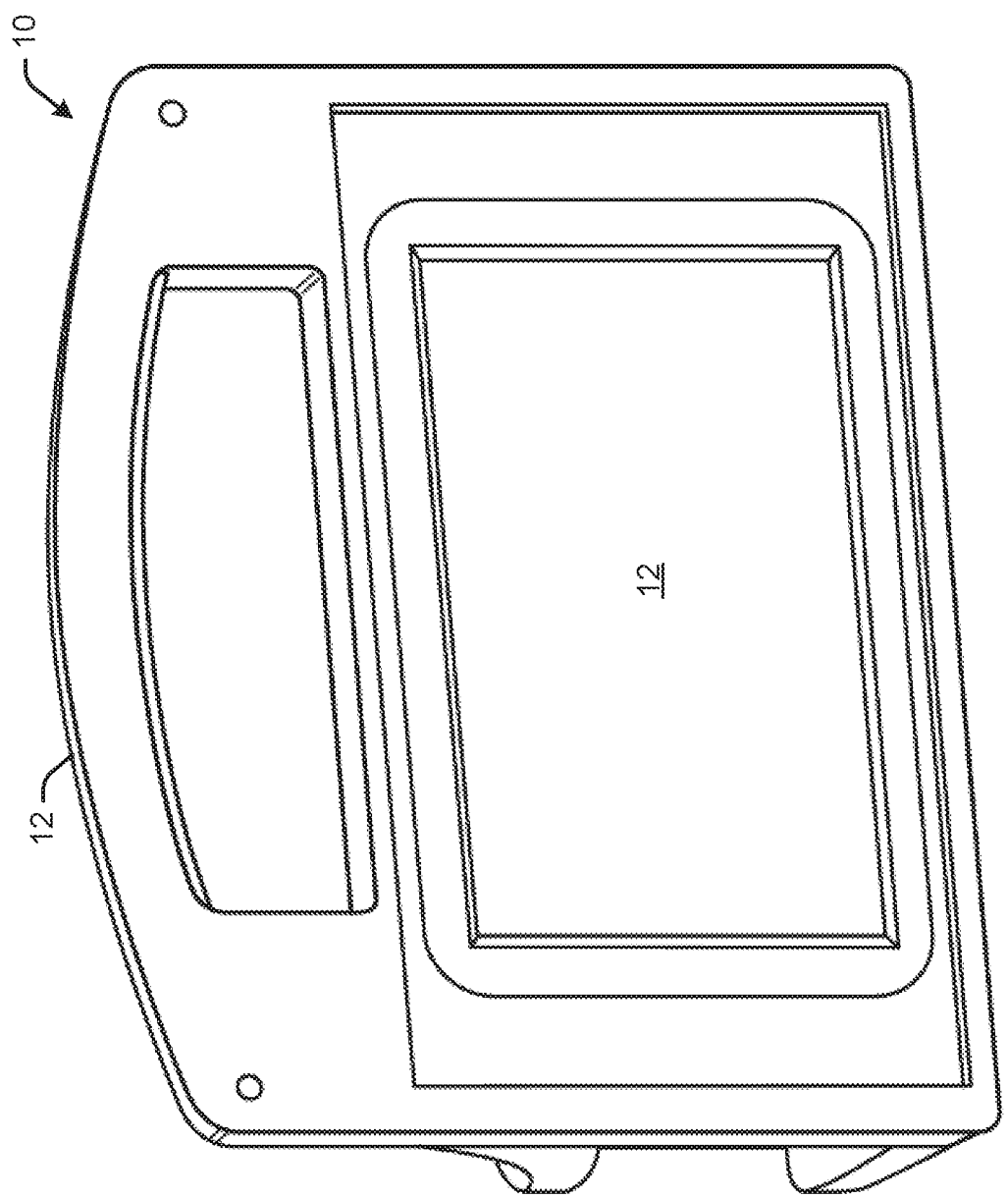
FIG. 1 is a front perspective view of an example electrical drain test device.

Parasitic electrical drain test systems and methods are disclosed herein to diagnose electrical faults (e.g., parasitic current drain) without a traditional ammeter. In an example, the electrical drain test systems and methods may be used by an experienced professional and/or a so-called "garage mechanic" or layman with no experience needed. The electrical drain test systems and methods can be used to test any electrical system (e.g., automotive, marine, aircraft, recreational vehicle, etc.), regardless of complexity, make or model, to reduce the time to diagnose and repair, increase productivity during diagnostics and repair, and increase accuracy with a conclusive result and further aid in diagnostics to complete repair.

An example parasitic electrical drain test device includes a battery interface system having electrical cables to connect in-line with the negative battery post of a battery and an electrical system under test. The electrical drain test device also includes a battery disconnect switch. The switch may have a first position to electrically connect the battery and the electrical system. The switch may also have a second position to electrically connect the electrical system under test to the battery through a test circuit to test the electrical system under test for parasitic drain. The switch may then have a second position where the electrical system is connected to the device without losing connectivity to test the electrical system without having to reset the test or vehicle modules. The example electrical drain test device also includes an output device (e.g., a touch screen monitor) to output a conclusive pass/fail result of the test of the electrical system.

Output of the test may include a "pass" or "fail." In an example, output may include a "fast pass," a "fast fail," a "pass" after a full test, and a "fail" after a full test. Testing may include a first mode and a second mode. In a first mode, testing may result in a fast pass, a fast fail, or no result. If no result is generated by testing in the first mode, then testing may enter a second mode. In the second mode, testing may result in a fast pass (but not a fast fail), a "pass" after a full test, and a "fail" after a full test.

In an example, the result of the test may be displayed in flashing green when it passes, and flashing red when it fails. The example device may also include historical diagnostic output to aid in repair, additional testing, and future comparisons. Historical output shows the life of the test cycles while the diagnostic output produces a "within limit" result (e.g., displayed in green) or an "over limit" result (e.g., displayed in red).

In an example, the test circuit starts the test of the electrical system under test in a first mode. The first mode has a fast pass-fail. The test circuit stops the test of the electrical system in response to detecting a fast pass-fail and the output device outputs the results of the fast pass-fail. Testing may be implemented using discriminatory filters which measure for current and/or time thresholds. The thresholds may vary based on design considerations, such as but not limited to the type of test being performed, the system under test (e.g., including but not limited to battery type and/or cold cranking amps, number of batteries, etc.), and external conditions (e.g., temperature).

In an example, the first mode passes when measured current is less than a first mode current threshold and time is greater than a first mode time threshold. The first mode fails when measured current is over a fast fail limit for a predetermined rate.

In an example, if the first mode does not pass or fail, then the test circuit continues the test of the electrical system under test in a second mode. The second mode has a fast pass, a full pass-fail, and a surge fail. In the second mode, testing fast passes when measured current is under a fast fail limit. If testing in the second mode does not result in a fast pass, then the second mode may pass when measured current is less than a second mode current threshold and time is greater than a second mode time threshold. Otherwise, testing in the second mode may fail. Surge fail occurs when the accrued time exceeds threshold time over a surge current limit. This only occurs during the second portion of the overall test.

The test device may be used for any of a variety of different electrical systems, e.g., to test for parasitic current drain. The test device is thus said to be "independent" of the system under test. For example, the test device may be used for any vehicle type, for any electrical system type (e.g., automotive, marine, aircraft, etc.), and to test any size electrical system (e.g., 12V, 24V, 36V, etc.). It may also have a secondary feature allowing the device to aid the user in diagnostics, with standard output such as "within limits" or "exceeds limits." The device can also be connected to other systems (e.g., computer and display devices) for further analysis of the output to facilitate diagnostics and repair.

The test device may include a heartbeat mode, wherein output is shown "beating" (e.g., a display output blinks at different speeds). Blinking may be faster when the current being measured is high, and may be slower when current is low and pulsing or "beating" (e.g., a yellow color) to show that testing is still in progress. Thus, the technician can see with a simple glance that testing may be nearing an end (e.g., as blinking slows). As such, the heartbeat serves as a visual reference for the technician or other user without having to understand manufacturer-specific specifications. The test device may also be used in an unmanned mode. For example, the test device may flash when the testing is complete (e.g., a green color if passed; and a red color if failed), so that a technician or other user working on another project (e.g., another vehicle across the garage) can see when the testing is completed without having to stand there waiting. As such, the device outputs a result, not just a current reading, thus reducing ambiguity.

Secondary diagnostics mode enables further diagnosing of the problem should a test fail. For example, after the test is complete (e.g., pass or fail), a "Graphs" button changes "Playback" to enable the user to view the results of the test over time. After quitting the test and changing to the diagnostics mode, other systems, components, fuses, etc. may be tested to determine whether the result is within or over limit to facilitate repair. A historical mode enables users to download information for sharing, comparison, and/or further analysis or discussion.

Before continuing, it is noted that as used herein, the terms "includes" and "including" mean, but is not limited to, "includes" or "including" and "includes at least" or "including at least." The term "based on" means "based on" and "based at least in part on." It is also noted that the term "mode" is used broadly herein and may encompass different algorithms executing during separate portions of the same test or test duration.

Figure 2:
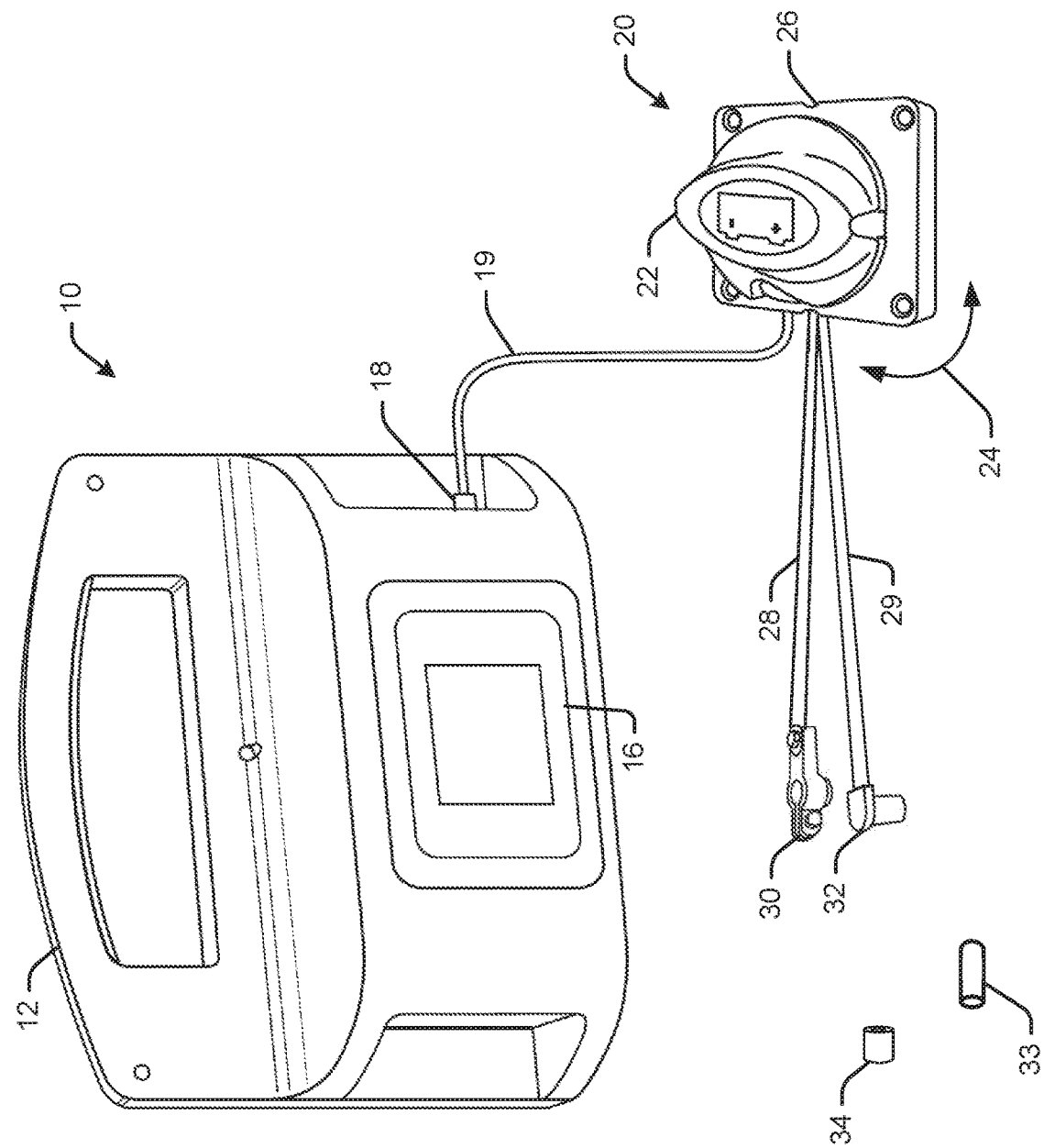
FIG. 2 is a rear perspective view of the example electrical drain test device and the battery interface system shown in FIG. 1.

FIG. 1 is a front perspective view of an example electrical drain test device 10. FIG. 2 is a rear perspective view of the example electrical drain test device 10 shown in FIG. 1. The example electrical drain test device 10 shown in FIGS. 1-2 may include a housing 12 for a test circuit configured to test an electrical system for parasitic drain. A result of the test can generated for a user on an output device such as display 14.

It is noted that the electrical drain test device 10 is not limited to any particular type of output. Other output may include, but is not limited to, audio output, printed output, electronic data output. In an example, output may be via a wired or wireless network connection (e.g., via the Internet or local area network). Such a network interface may provide current charts to a data store of charts for comparison and diagnostics. For example, a technician or other end-user of the test device 10 may compare the results of a test to prior tests to look for similarities in prior tests (tests run by the same end-user, or by other users) to aid in identifying a faulty component in the system under test.

The example electrical drain test device 10 may also include a battery compartment 16. The battery compartment 16 may house disposable or rechargeable batteries to power the test device 10 without having to be near an electrical outlet. However, the electrical drain test device 10 is not limited to operating on battery power, and may also include a connection for an AC outlet (not shown).

The example electrical drain test device 10 may have a battery interface connection 18 to make an electrical connection between the negative battery terminal of a battery and an electrical system under test. In an example, a cable 19 may be connected through a switch 20 to the system under test. The switch 20 may be configured for continuous provision of electrical current in a first position between the battery and the electrical system, and in a second position between the electrical system-device-battery.

In an example, the switch 20 may include a knob or handle 22 which can be rotated (e.g., in the direction of arrows 24) between a first position and a second position to make electrical connections. Switching components may be provided in housing 26, and are explained in more detail with reference to FIGS. 5A-5B, below. In one of the positions, the switch 20 provides a path for continuous electrical current flow between the battery and the electrical system under test. When moved to the other position, the switch 20 provides a path for continuous electrical current flow between the battery, through the test device 10, and the system under test.

An example test device 10 may also include a two-terminal universal battery connection with adapter for both top post and side mount. For example, cable 28 may have a first type terminal connection 30 for connection to a top post battery connector. Cable 29 may have a second type terminal connection 32. Adapters 33 and 34 may also be provided, as will be described in more detail below with reference to FIGS. 3A-B and 4A-B, thus making it applicable to different battery configurations.

FIGS. 3A-B and 4A-B show a battery 1 illustrating connection of an example electrical drain test device 10. In this illustration, battery 1 may be an automotive battery, although the test device 10 may be used with any type of battery (e.g., automotive, marine, aircraft, etc.) and/or any electrical system (battery or non-battery).

In an example, a connection sequence may be followed for operating the test device 10. An example connection sequence includes, but it not limited to, a) disconnecting the negative battery terminal, b) connecting the test device to the negative battery terminal, c) connecting the test device to the system under test, d) switching on the system under test (e.g., by starting the vehicle engine, and perhaps even operating various electrical systems such as the heater, horn, radio; or even driving the vehicle over a predetermined speed for a predetermined time), shutting the system under test (e.g., turning off the engine and removing the key, and shutting all doors), e) switching to the test device, and f) starting testing.

The battery 1 is illustrated having top post terminals 2 and 3. Terminal 2 is electrically positive, and terminal 3 is electrically negative. Side post terminals 4 and 5 are also illustrated. Terminal 4 is electrically positive, and terminal 5 is electrically negative. Although a battery may only have top post terminals or side post terminals (some may have both), both top post and side post terminals are shown in FIGS. 3A-3B to illustrate the test device 10 connected with either type of terminal. Of course, it is noted that the test device 10 may be configured to be connected with other types of batteries and/or electrical systems and is not limited to any particular type of power source. Indeed, the connection the electrical system may be made at other locations, and it is not limited to connecting via a battery.

The battery 1 may be connected to a system under test with post connectors 6 and 8 via electrical cables 7 and 9, respectively. In an example, top post connector 8 is shown removed from the negative post terminal 3 in FIG. 3B for connection to the test device 10. Likewise, a side post connector could also be removed. Connection to the test device 10 is illustrated in FIGS. 4A-B.

In the example shown in FIG. 4A (e.g., for a top post battery), a terminal connection 30 of the test device 10 is connected to the negative top post terminal 3. The post connector 8 that is removed from the battery may be connected to the terminal connection 32 of the test device 10.

In the example shown in FIG. 4b (e.g., for a side post battery), the adapters 33 and 34 are used. For example, the adapter 33 may be threaded into a threaded opening formed in the terminal connection 32 of the test device 10, and the side post connector 8 (that has been removed from the negative side post of the battery 1) connected thereto (e.g., via nut 5a, also removed from the negative side post of the battery 1). The adapter 33 for the terminal connection 32 may be substantially cylindrical in shape having a diameter substantially the same size as the a side post terminal 5, so that the negative post connector 8 can be fitted thereon just as the negative post connector 8 is fitted onto the side post terminal 5.

The adapter 34 may be threaded onto the negative side post 5 of the battery, and then the terminal connection 30 of the test device 10 is connected to the negative side post terminal 5 of the battery 1. In an example, the adapter 34 may be substantially cylindrical in shape having a diameter substantially the same size as a top post terminal. The adapter 34 may have a threaded opening formed therein to enable threading the adapter 34 onto the side post terminal 5. As such, the adapter 34 provides a base to connect the terminal connection 30.

The test device 10 is illustrated in FIGS. 4A-B as it may be connected to either a battery having either (or both) top post or side post terminals using the same two terminal connections 30 and 32. As such, the terminal connections 30 and 32 are referred to herein as "universal" terminal connections. That is, the same two terminal connections can be used with different types of battery post terminals without having to provide separate wiring and terminal connections for every different type of battery the test device may be used with.

It is noted that the test device 10 is not limited to use with any particular type of battery and/or battery connection, and may be configured for connection to any electrical system under test regardless of electrical current source.

Figure 5A:
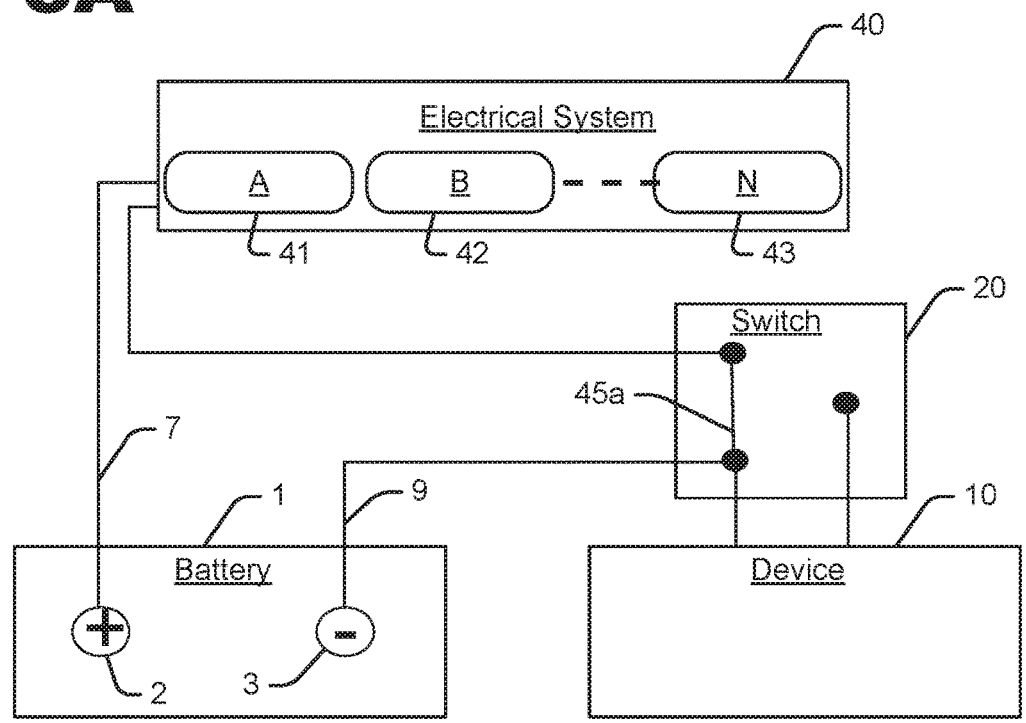
FIGS. 5A-B are block diagrams illustrating connection of an example electrical drain test device to an electrical system.
Figure 5B:
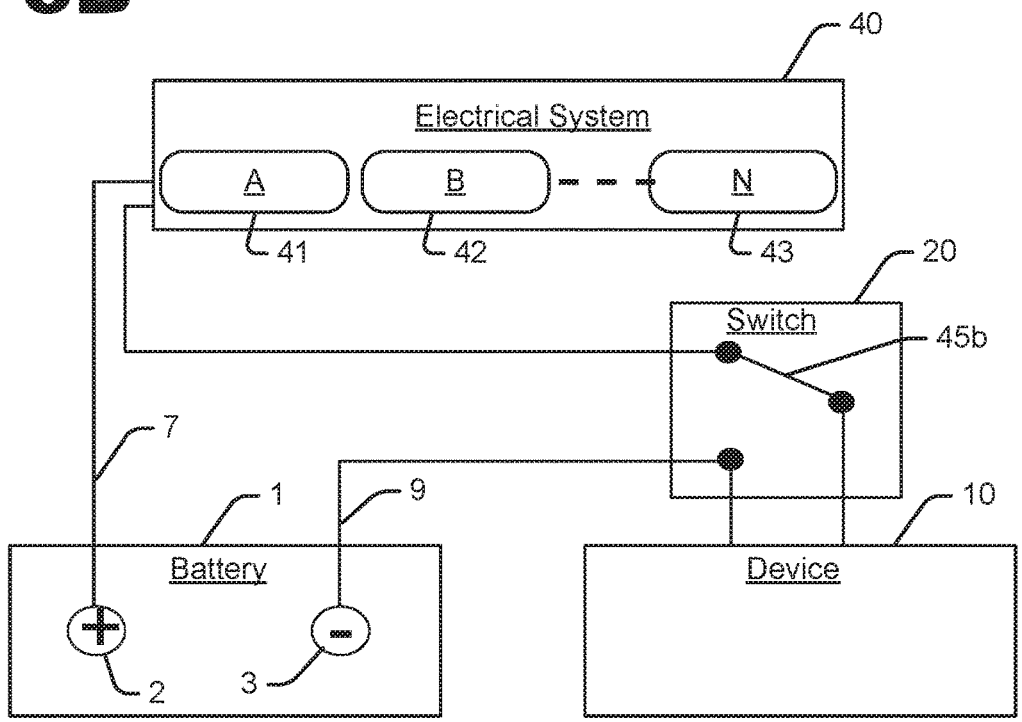

FIGS. 5A-B are block diagrams illustrating connection of an example electrical drain test device 10 to an electrical system 40. It is noted that the electrical system 40 may include any type and any number of electrical components and/or subsystems which may result in a parasitic current drain. For purposes of illustration, the electrical system 40 is shown including components or subsystems 41-43.

In an example, the negative terminal is disconnected from the battery 1, e.g., as described above for FIGS. 3A-B. The test device 10 is then connected to the electrical system 40 and battery 1 via switch 20. For example, the switch 20 may be connected in series with the negative terminal 3 of battery 1, e.g., as described above for FIGS. 4A-B.

In a first position 45a, the switch 20 may connect the battery 1 directly with the electrical system 40. As such, the electrical system 40 remains energized. This may be particularly desirable for an electrical system 40 which behaves differently when connected to a battery 1, as it gives a more accurate picture of the electrical system during testing. In an example, the vehicle engine may even be started and run or operated after connecting the test device 10 and with the switch 20 in the first position 45a, so that the electrical system behaves during testing as it would without the test device 10. The battery interface design connected to the parasitic drain test device provides a perpetual and uninterrupted connection to the electrical system. It can seamlessly be switched between car and device and vice-versa, without interrupting or having to reset the test or vehicle modules.

After the test device 10 has been connected and the electrical system has been energized (e.g., the vehicle engine started and/or run), the switch may be moved to a second position 45b, as illustrated in FIG. 5B. The test device 10 is now ready for testing. It is noted that after initial connection, the system under test remains in electrical connection with the battery (or other power source) regardless of the switch position 45a, 45b. As such, the test results are more accurate and much better than can be provided using an ammeter or other testing device in which the battery is disconnected from the system under test (i.e., capacitors do not discharge, and the system remains energized, similar as if the system under test remained in its normal operating condition).

Figure 6:
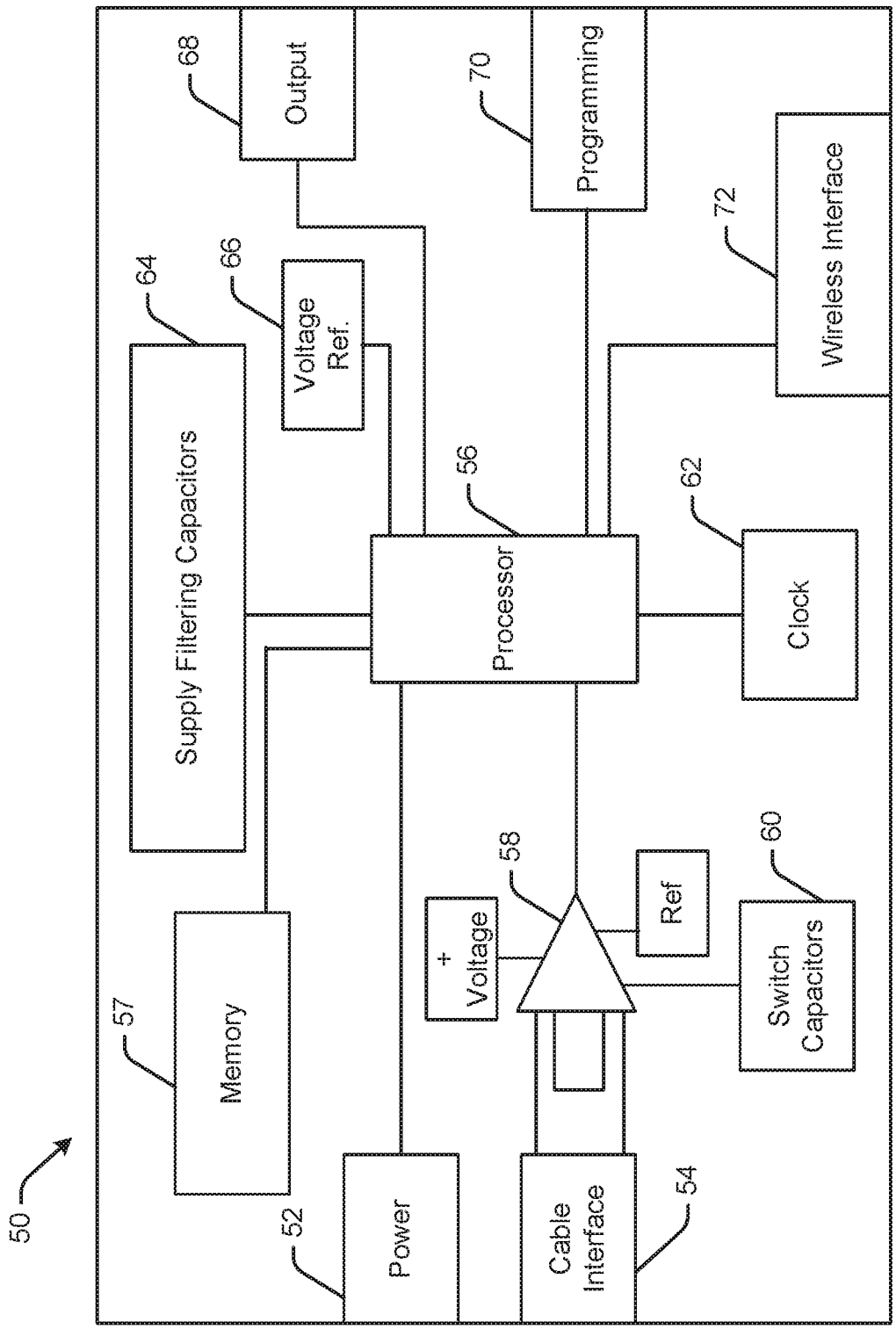
FIG. 6 is a block diagram illustrating components of an example electrical drain test device.

FIG. 6 is a block diagram illustrating components 50 of an example electrical drain test device 10. In an example, the test device 10 has a power source 52 (e.g., device batteries, which may be different than the battery 1 providing power to the system under test). Other power sources may also be provided, such as but not limited to a generator, an AC electrical source, solar panels, and even power from the battery 1. The test device 10 also includes a cable interface 54 to connect the test device 10 to the electrical system under test (e.g., via connection 18 and cable 19 to switch 20 shown in FIG. 2).

In an example, the test device 10 includes a processor 56 and memory 57. The processor 56 receives power from power source 52. The test device 10 receives electrical signals (e.g., electrical current and/or data) from the cable interface 54 via operational amplifier 58 and switch capacitors 60. The processor also receives clock signal 62 for timing the test operations. Analysis of the current is handled by the processor through various subcomponents, such as supply filtering capacitors 64, and a voltage reference 66.

Output may be generated by the processor 56, for delivery to an output 68 (e.g., the display 14 in FIG. 1. The processor 56 may also receive input (e.g., user preferences and/or other programming) via interface 70.

Figure 7A:
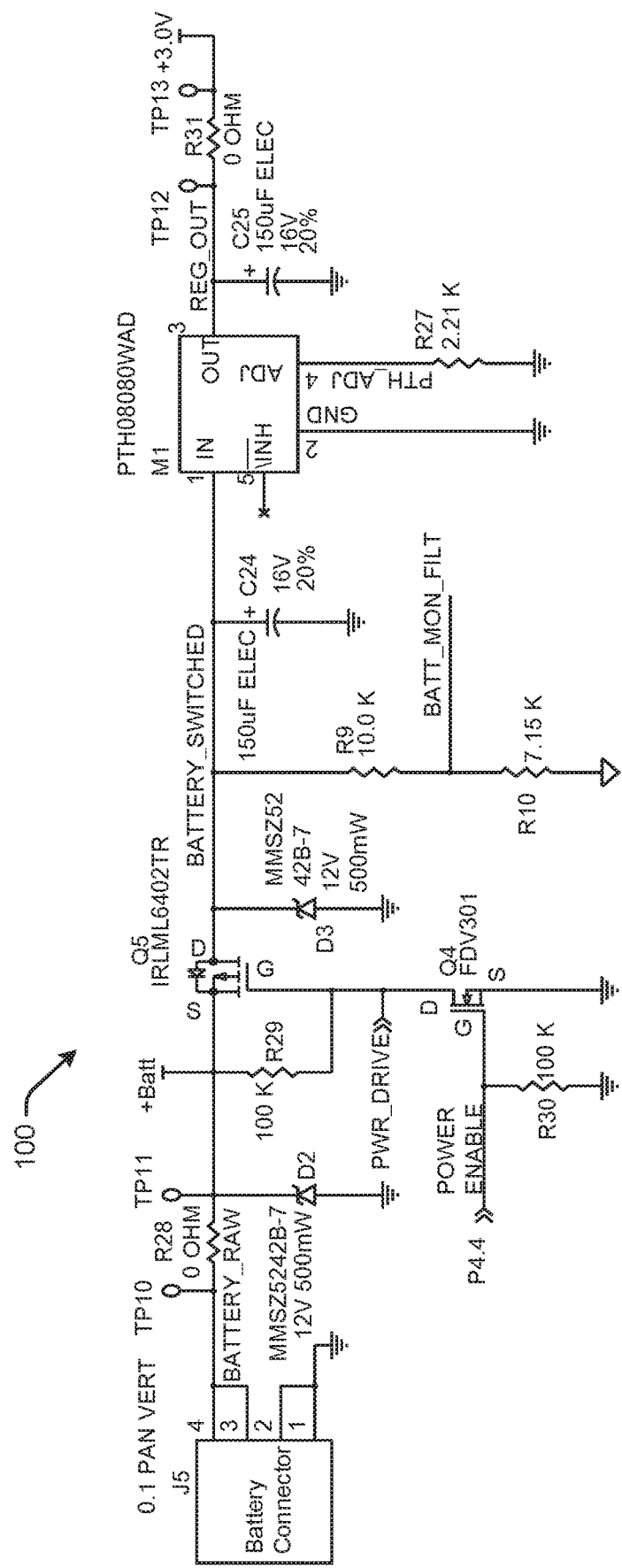
FIGS. 7A-C are circuit diagrams showing example circuit implementations of an example electrical drain test device.
Figure 7B:
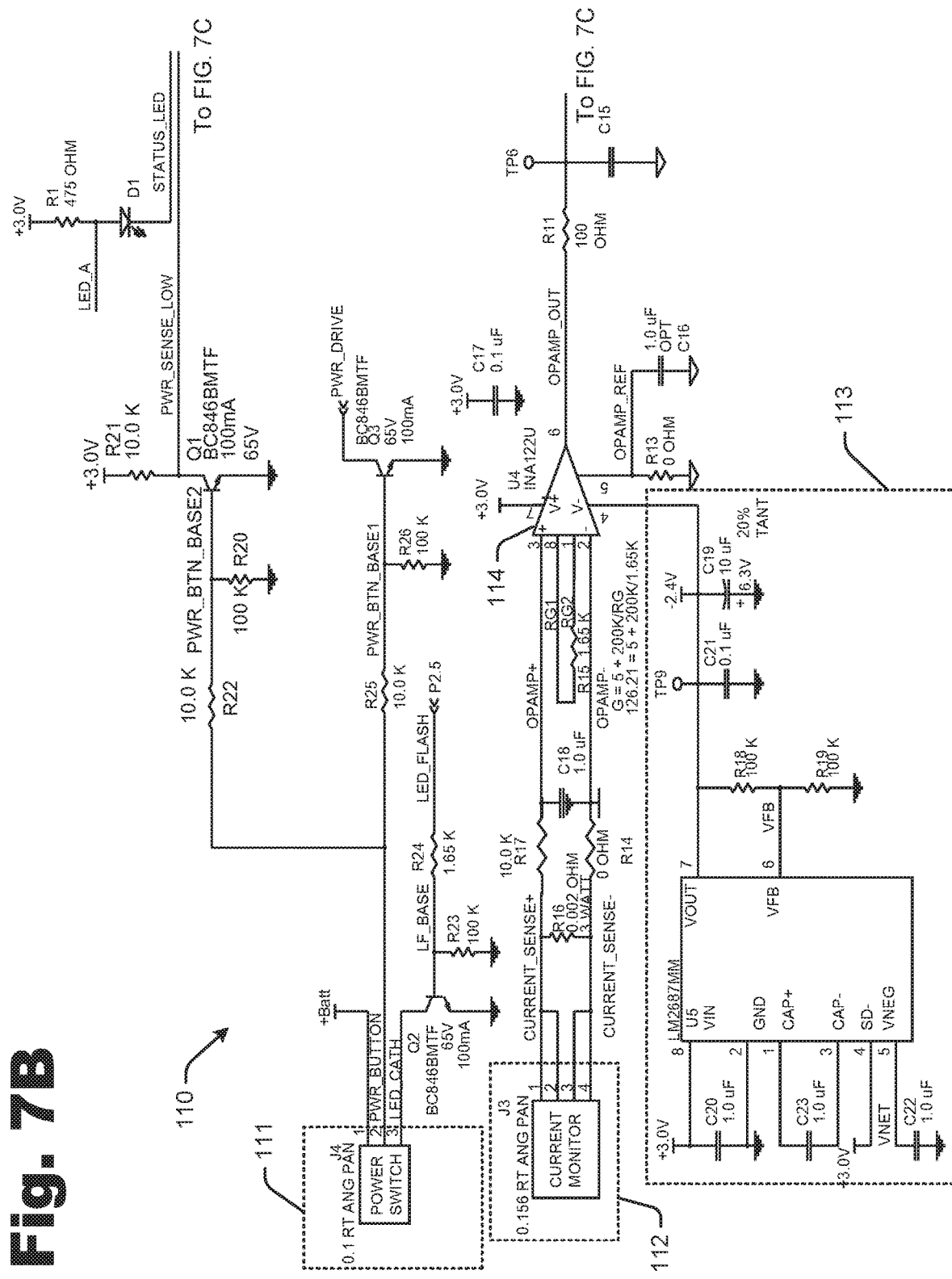
Figure 7C:
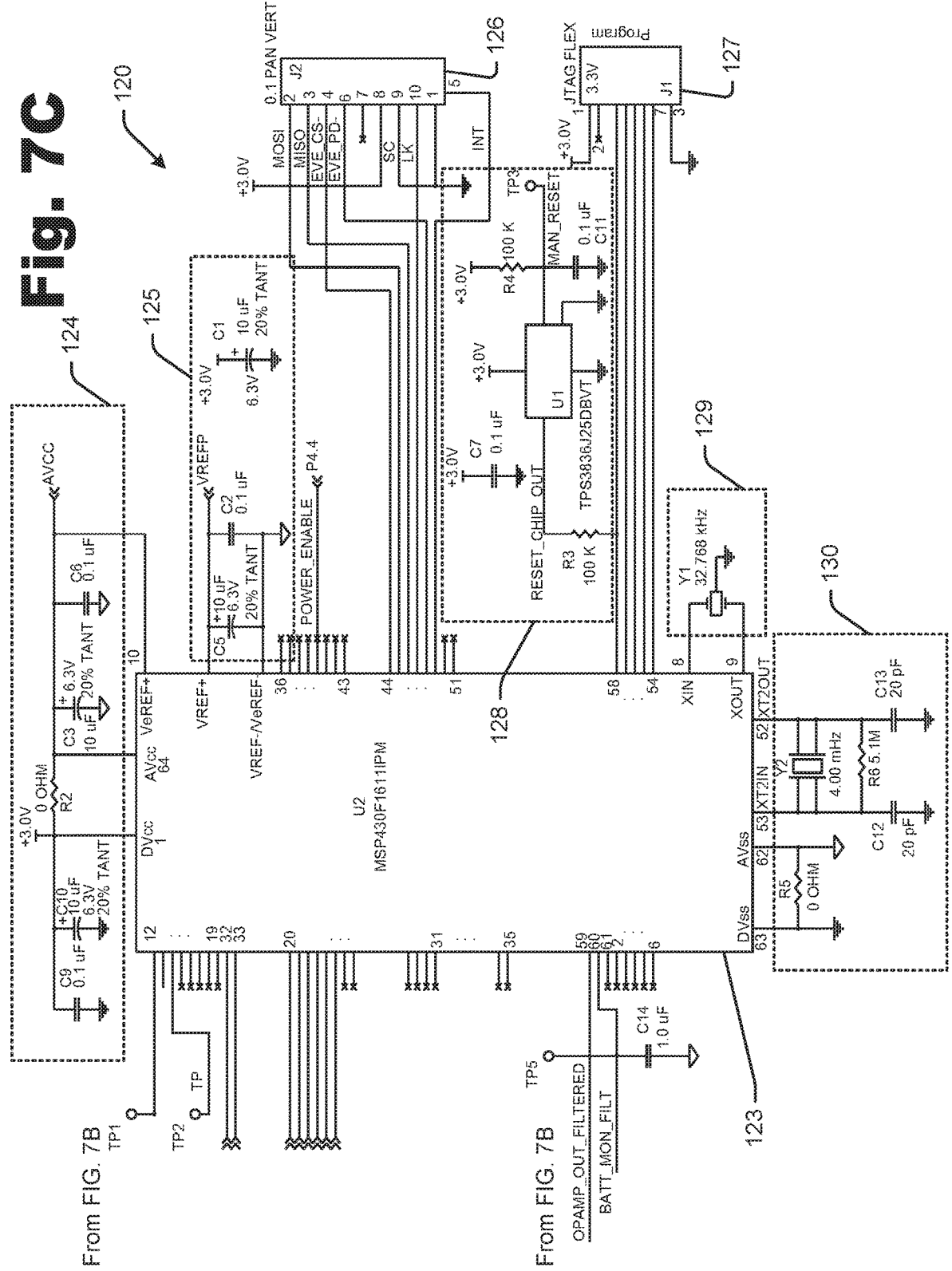

In an example, test device 10 may be implemented in hardware (e.g., device circuitry as illustrated by FIGS. 7A-C), and program code (e.g., firmware or other machine readable instructions). The program code may be stored on a non-transient computer readable medium (e.g., memory 57) and executed by a processor (e.g., processor 56). Although, it is noted that the operations described herein may be executed by program code residing on the device 10 itself, in another example, at least some of the operations may be performed on a separate computer system (e.g., a server computer having more processing capability). The operations described herein are not limited to any specific implementation with any particular type of program code.

In an example, the device 10 may be connected to a communication network 130, such as a local area network (LAN) and/or wide area network (WAN). In an example, the network includes the Internet, the "cloud," or other mobile communications network (e.g., a 3G or 4G mobile device network). The network may provide access to remote processing stations (e.g., a server computer for a repair shop) and/or enable the device 10 for use in distributed environments for further diagnostics (e.g., comparison with output generated by other users of the device).

In an example, the test device 10 may also include a wireless or other network interface 72 (e.g., a BLUETOOTH™ connection) to enable data upload and/or download. For example, the wireless interface may connect to a mobile device such as a phone or tablet, a personal computer (PC) or laptop, or other device, to compare with previous testing by the same user or that of other users. Such comparisons may enhance diagnostics since the user can see historical data. For example, if test output is the same or similar to prior test output associated with a particular component fault, then the user can try testing that same component to determine if that component is also causing the problem with the electrical system under test.

The output generated by end-users may be available locally (e.g., within a repair shop) and/or be physically distributed (e.g., via the Internet, a private "cloud," or other network). In an example, the data may be gathered to identify test patterns. For example, if output test pattern is "A", then it is likely that the cause of the fault is "B." However, there is no limit to the type or amount of data that may be generated and/or manner in which the data is processed. For example, the data may be unprocessed or "raw" data, or the data may undergo at least some level of processing (e.g., before sharing with other technicians).

FIGS. 7A-C are circuit diagrams showing example circuit implementations of an example electrical drain test device 10. It is noted that the circuit diagrams are provided for purposes of illustration of an example circuit. However, the circuit diagrams are not intended to be limiting. Those having ordinary skill in the art will understand, after becoming familiar with the teachings herein, various modifications to the circuit diagrams.

FIG. 7A shows an example circuit diagram for a power supply of the test device 10. FIGS. 7B-C shows an example circuit diagram of the test device. The circuit diagram of FIGS. 7B-C are connected on the right hand side of FIG. 7B and the left hand side in FIG. 7B, as marked on the diagrams.

In FIG. 7B, the circuit diagram 110 includes a power switch 111 and current monitor 112, switch capacitor 113 (enabling current readings at or near zero), and instrumentation op amp 114.

In FIG. 7C, the circuit diagram 120 includes a processor 123, supply filtering capacitors 124, a precision voltage reference 125, output 126 (e.g., to display or user interface), programming 127 (e.g., for input such as post-flash programming), voltage reset circuit 128, a timer 129 (e.g., crystal timer), and clock 130.

Example operations may be implemented at least in part using a user interface (e.g., web-based interface). In an example, the end-user is able to make selections with the user interface, and the components and operations described above are implemented to present output to a user. The user can then make further selections.

Figure 8A:
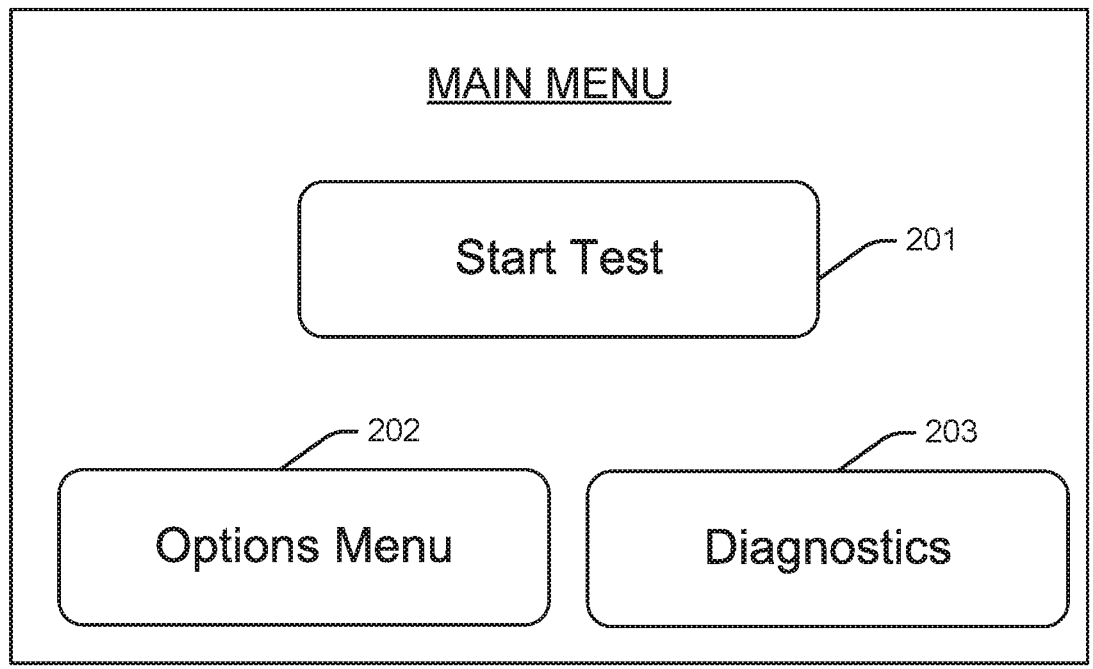
FIGS. 8A-C show a user interface of an example electrical drain test device, illustrating example menu options.
Figure 8B:
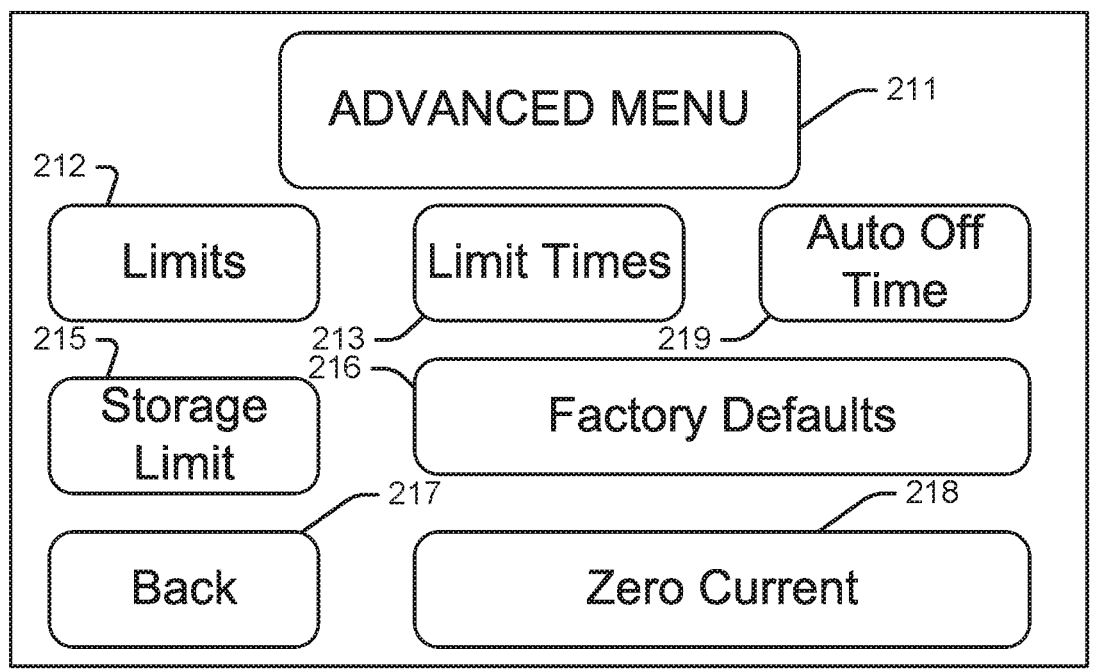
Figure 8C:
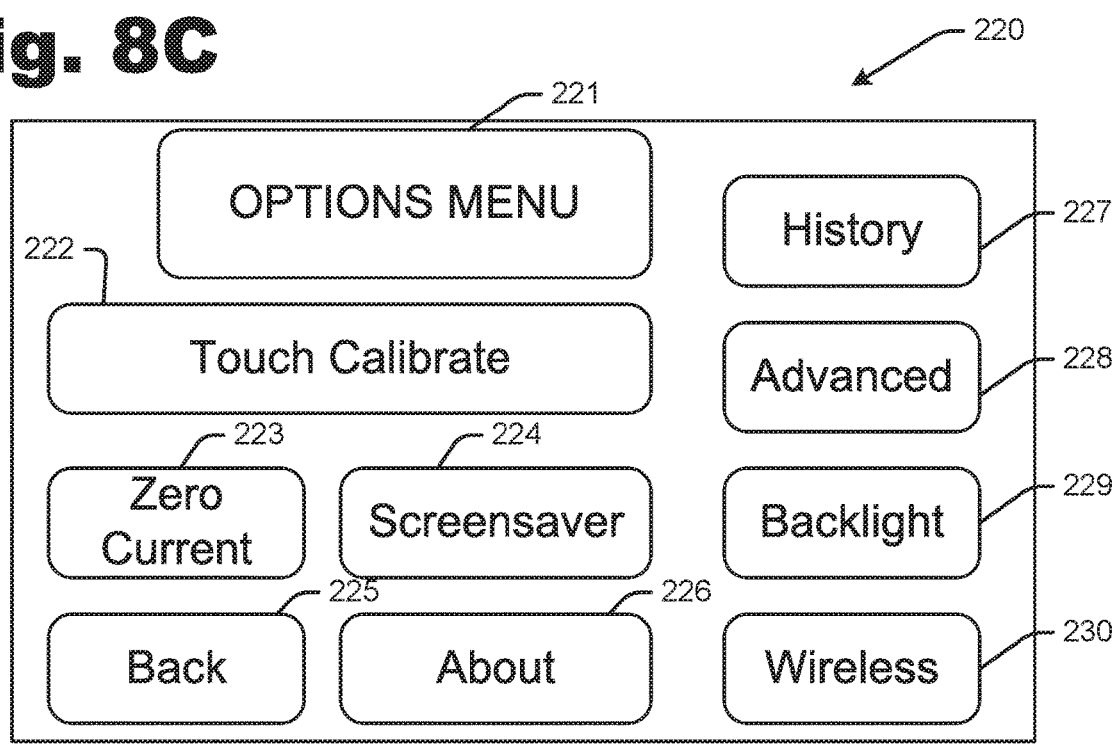

FIGS. 8A-C show a user interface of an example electrical drain test device 10, illustrating example menu options. In FIG. 8A, the interface 200 is shown as it may display a Start Test selection 201 to start testing (see, e.g., FIG. 9A), an Options Menu selection 202 to select the Options Menu (see, e.g., FIG. 8B), and a Diagnostics selection 203 to aid in and enable review of diagnostics (e.g., compare recent or past test results). Other systems and/or components of the vehicle can also be connected to the device to provide a result that will help determine if it is within specifications or exceeds specifications so that repair can be completed.

In FIG. 8B, the Advanced Menu interface 210 is shown as it may display an Advanced Menu 211, including selections for making various adjustments to the device. In an example, the Advanced Menu 211 selections are only made available to the device manufacturer; although the sections may also be made available to some (e.g., advanced) users, or all users. Advanced Menu 211 may include Limits selection 212 (e.g., for current thresholds), Limit Times selection 213 (e.g., for time thresholds), Auto Off Time selection 214 (e.g., to shut the device automatically), Storage Limit selection 215 (e.g., to adjust amount of data for onboard storage or memory), Factory Defaults selection 216 (e.g., to return the device to original settings), Back (or return) selection 217, and Zero Current selection 218 (e.g., to calibrate current measurements for temperature or other parameters).

In FIG. 8C, the Options Menu interface 220 is shown as it may display an Options Menu option 221, including selections for making various adjustments to the device. In an example, the Options Menu 211 selections are made available to all users. Options Menu 221 may include a Touch Calibrate selection 222 (e.g., calibrate the touch screen), Zero Current selection 223 (e.g., to calibrate current measurements for temperature or other parameters), Screensaver selection 224 (e.g., to set screensaver options), Back (or return) selection 225, About selection 226 (e.g., to display firmware version), History selection 220 (e.g., to view past usage), Advanced selection 228 (e.g., to make advanced selections, such as shown in FIG. 8B), Backlight selection 229 (e.g., to make selections to screen backlighting), and Wireless selection 230 (e.g., to setup BLUETOOTH™).

Figure 9A:
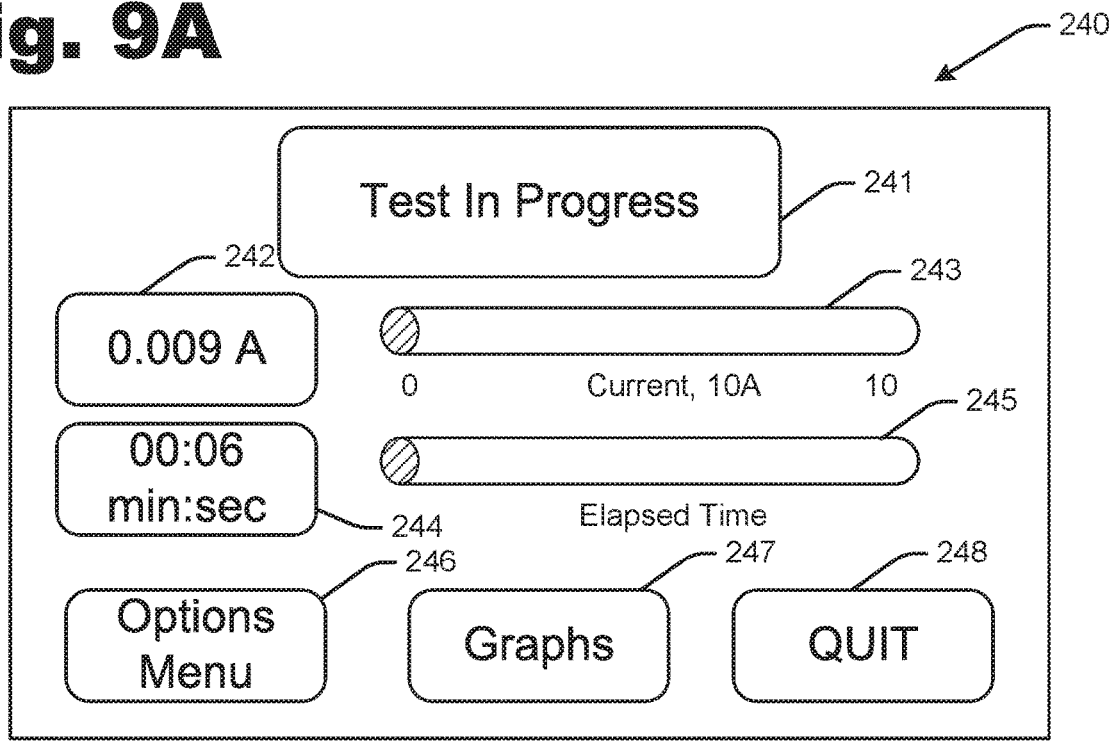
FIGS. 9A-C show a user interface of an example electrical drain test device, illustrating example tests.
Figure 9B:
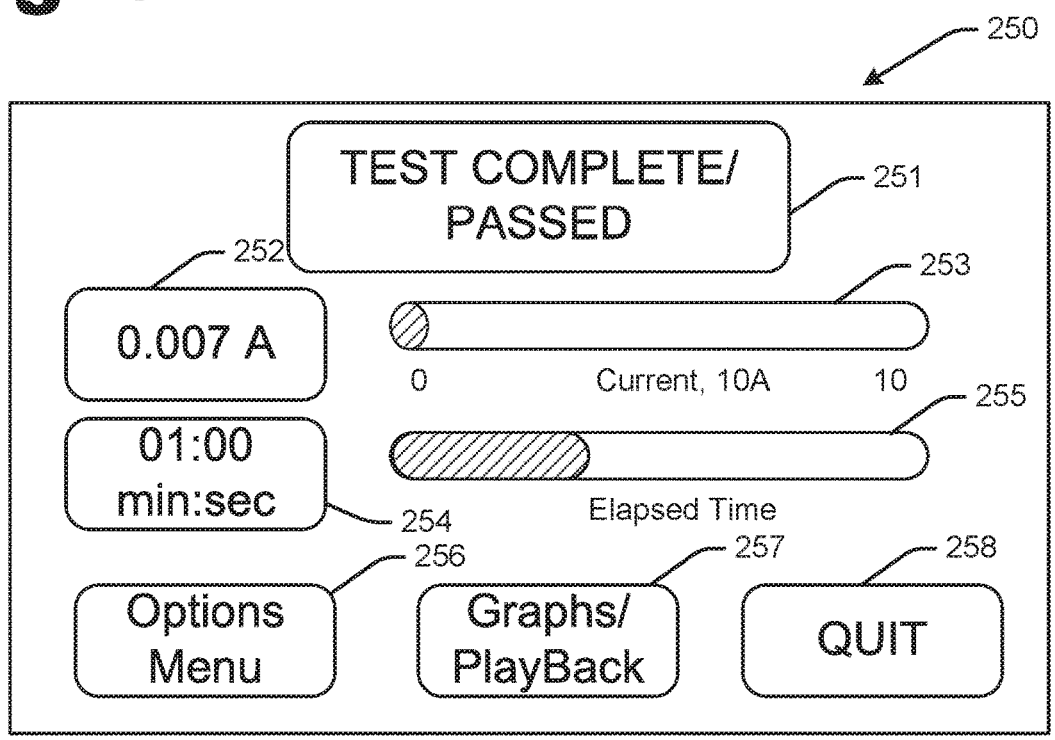
Figure 9C:
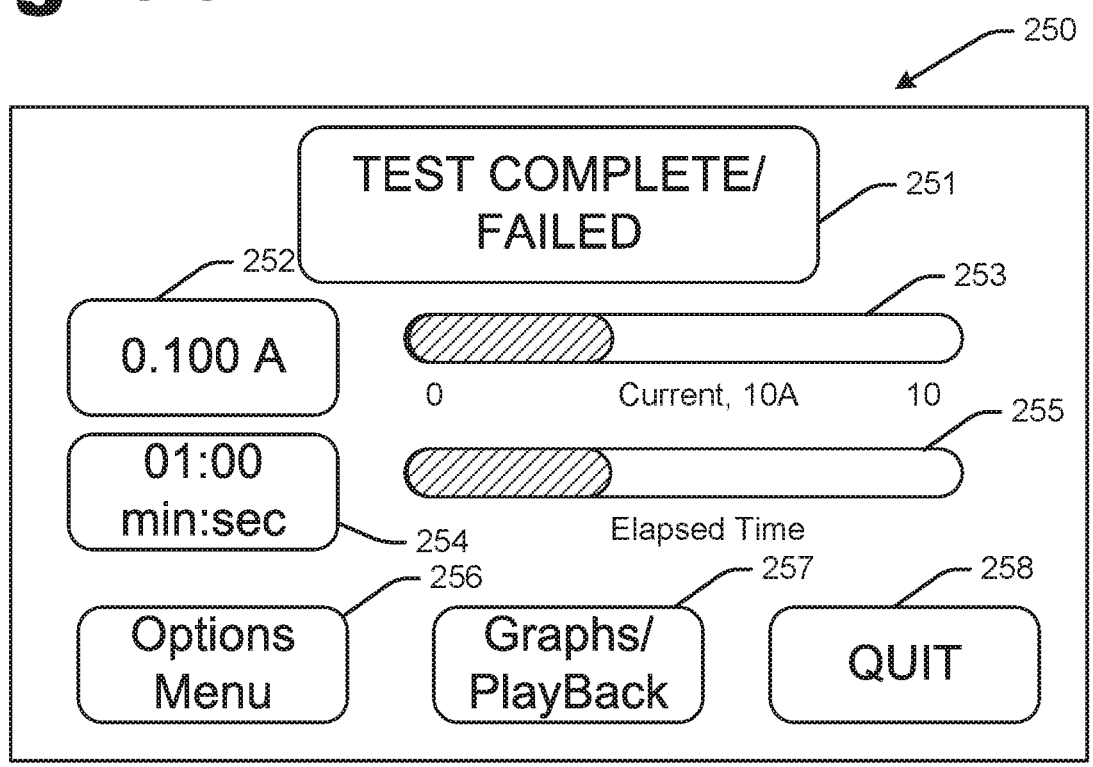

FIGS. 9A-C show a user interface of an example electrical drain test device, illustrating output during example tests. In FIG. 9A, the interface 240 displays Test In Progress 241, including a current measurement 242 and corresponding current meter 243, a time measurement 244 and corresponding elapsed time 245. User selections for Options Menu 246, Graphs 247, and Quit 248 are also displayed.

FIG. 9B shows an interface 250 illustrating output for an example Fast Pass 251. It is noted that the words "PASSED" may flash in green when the test is complete. Similar output may be generated for a Fast Fail, albeit in red as illustrated by FIG. 9C. Output may also include a current measurement 252 and corresponding current meter 253, a time measurement 254 and corresponding elapsed time 255. User selections for Options Menu 256, Graphs 257, and Quit 258 are also displayed. It is noted that the Graphs 257 button may change to "Playback" after the test is complete, so that the diagnostics mode can be entered.

In an example, the test starts testing of the electrical system in a first mode having a fast pass-fail test. The test stops testing in response to detecting a fast pass-fail, and outputs the results of the fast pass-fail. For example, the first mode fast passes (see, e.g., FIG. 9B) when measured current is less than a first mode current threshold and time is greater than a first mode time threshold. The first mode fails (see, e.g., FIG. 11A) when measured current is over a fast fail limit for a predetermined rate.

If the test does not result in a fast pass-fail during testing in the first mode, then testing continues the test of the electrical system in a second mode. In an example, the second mode has a fast pass test, a surge fail test (but not a fast fail test), and a full pass-fail test. For example, the second mode fast passes when measured current is under a fast fail limit (see, e.g., FIG. 9B). Or for example, the second mode passes (see, e.g., FIG. 10A) the long test when measured current is less than a second mode current threshold and time is greater than a second mode time threshold. Otherwise, the testing fails (see, e.g., FIG. 11A).

Figure 10A:
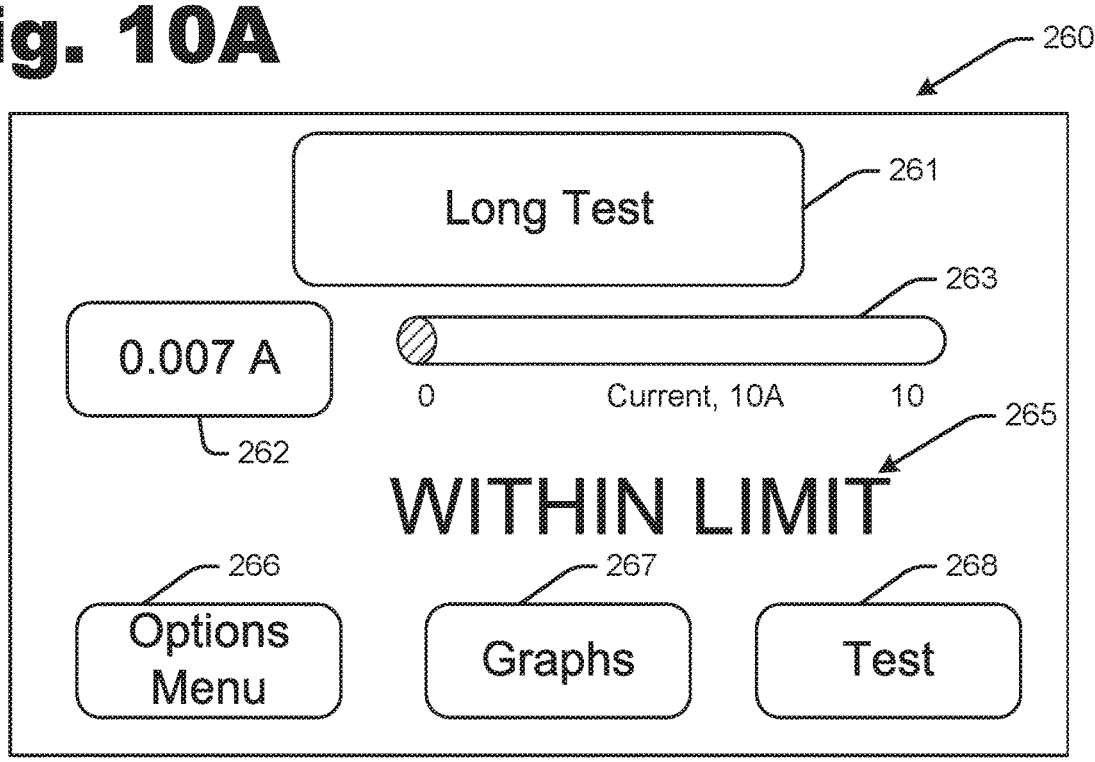
FIGS. 10A-B show a user interface of an example electrical drain test device, illustrating diagnostics following an example passed test.
Figure 10B:
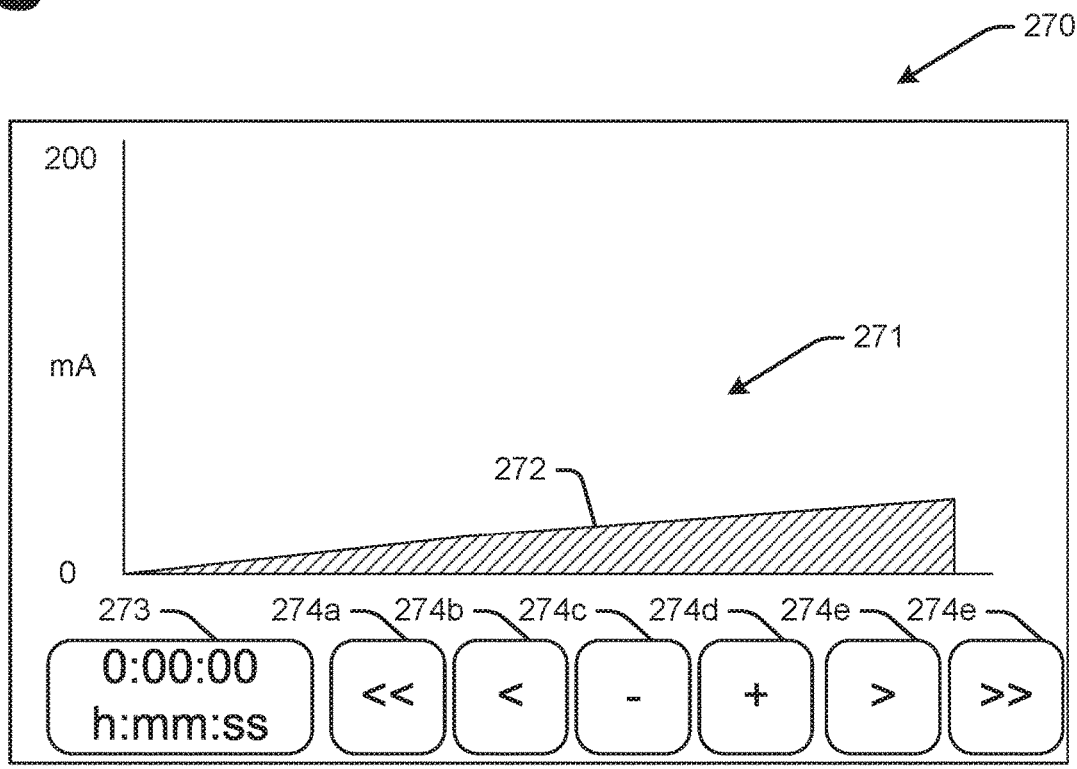

FIGS. 10A-B show a user interface of an example electrical drain test device, illustrating diagnostics following an example passed test. FIG. 10A shows an interface 260 illustrating diagnostics output following an example Long Test 261 which has passed. It is noted that the words "Long Test" need not be displayed. For example, a "Test" or the like may be displayed and flash in yellow to indicate testing is underway. Output may also include a current measurement 262 and corresponding current meter 263. As the long test passed in this example, the text WITHIN LIMIT 265 is also displayed. User selections are also displayed for Options Menu 266, Graphs 267 (see, e.g., FIG. 10B), and Quit 268.

FIG. 10B illustrates example output 270 from the test. Graph output may include a graph 271 showing a current plot 272 (e.g., measured current over time). The user is able to scroll through time on the graph and/or adjust the current scale using selection buttons 274a-f. The time 273 may also be displayed for each current reading.

Figure 11A:
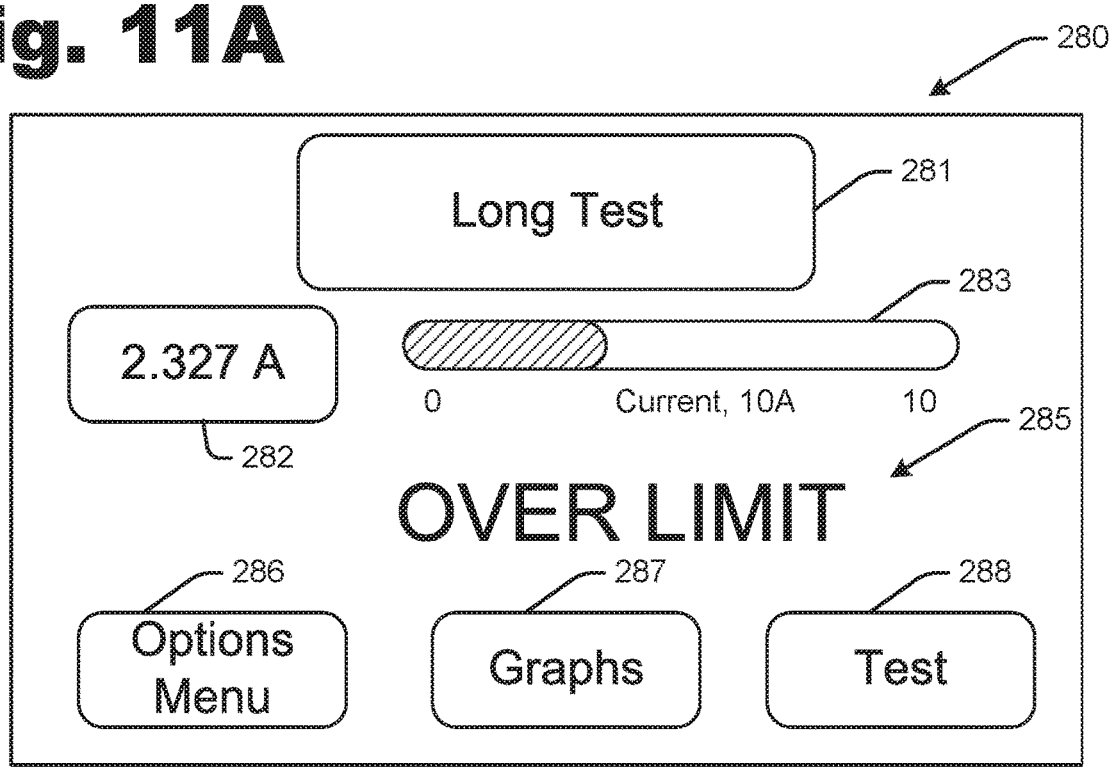
FIGS. 11A-B show a user interface of an example electrical drain test device, illustrating diagnostics following an example failed test.
Figure 11B:
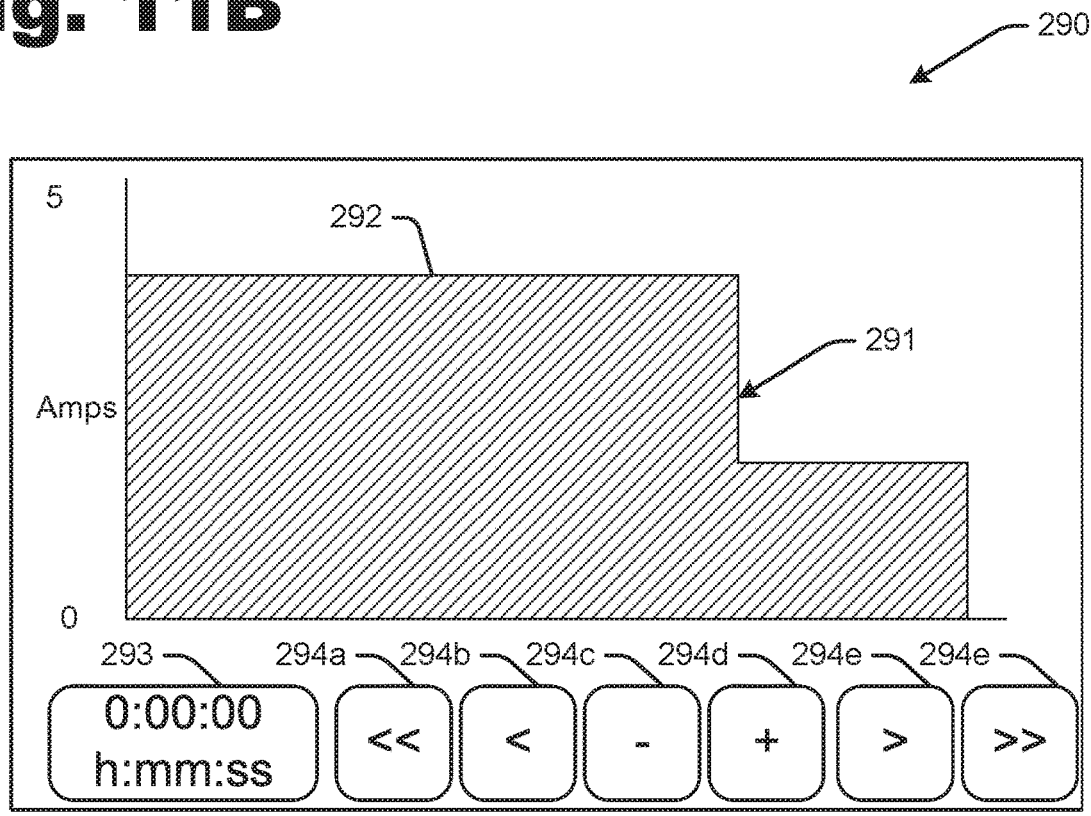

FIGS. 11A-B show a user interface of an example electrical drain test device, illustrating diagnostics following an example failed test. FIG. 11A shows an interface 280 illustrating diagnostics output following an example Long Test 281 which as failed. Output may also include a current measurement 282 and corresponding current meter 283. As the long test failed in this example, the text OVER LIMIT 285 is also displayed. User selections are also displayed for Options Menu 286, Graphs 287 (see, e.g., FIG. 11B), and Quit 288.

FIG. 11B illustrates example output 290 from the test. Graph output may include a graph 291 showing a current plot 292 (e.g., measured current over time). The user is able to scroll through time on the graph and/or adjust the current scale using selection buttons 294a-f. The time 293 may also be displayed for each current reading.

Although the output of FIGS. 10B and 11B include current plots available after testing, so called "live" current plots may also be displayed or otherwise available to the end-user during testing.

Before continuing, it should be noted that the examples described above are provided for purposes of illustration, and are not intended to be limiting. Other devices and/or device configurations may be utilized to carry out the operations described herein.

Figure 12:
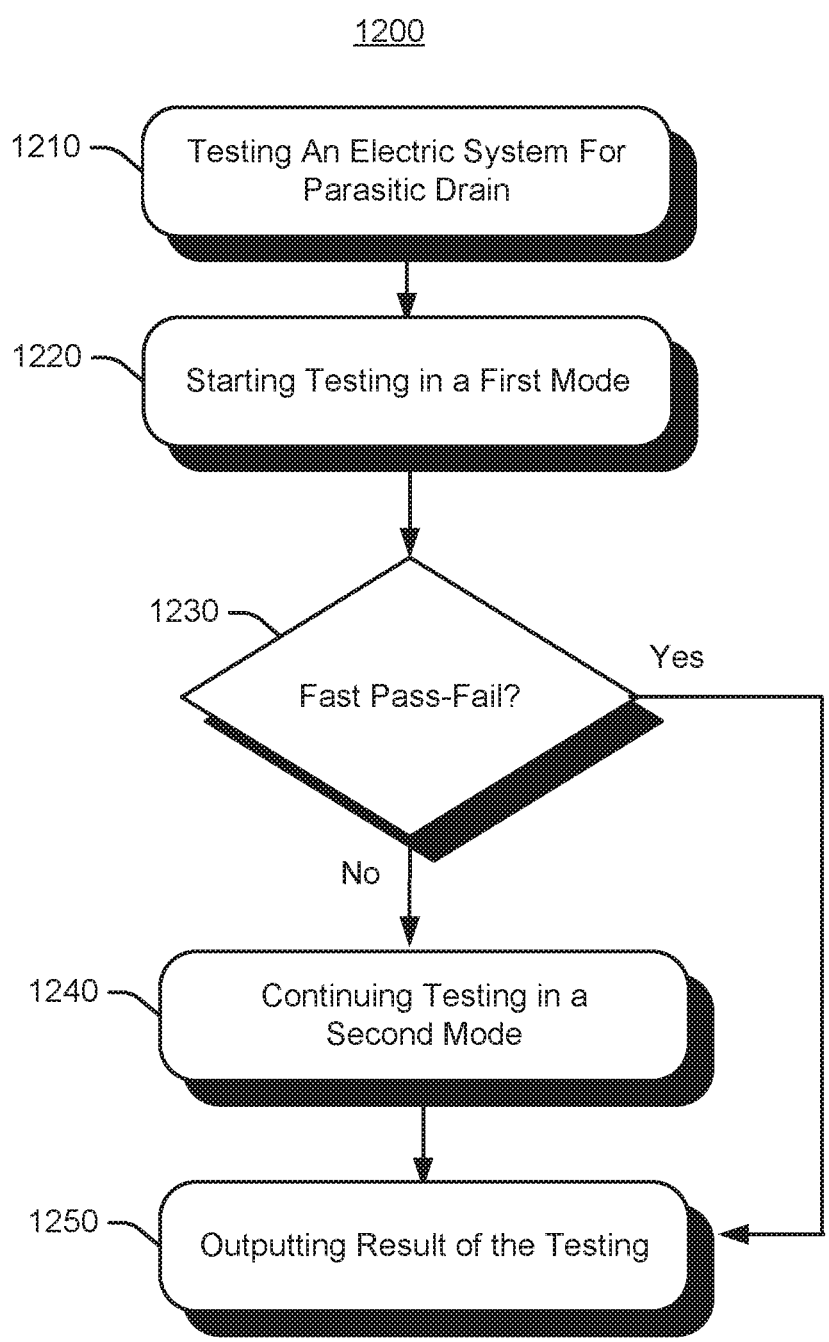
FIG. 12 is a flowchart illustrating example operations which may be implemented by an example electrical drain test device.

FIG. 12 is a flowchart illustrating example operations 1200 which may be implemented by an example electrical drain test device. In an example, the components and connections depicted in the figures may be used.

Operation 1210 includes testing of the electrical system. In operation 1220, the testing starts in a first mode. In operation 1230, the first mode may have a fast pass-fail. If the first mode passes, then testing ends and the result of testing is output in operation 1250. In an example, the first mode passes when measured current is less than a first mode current threshold and time is greater than a first mode time threshold. In an example, the first mode fails when measured current is over a fast fail limit for a predetermined rate.

If the first mode fails, testing of the electrical system continues in a second mode in operation 1240. In an example, the second mode includes both a fast pass and a full pass-fail. In an example, the second mode passes when measured current is less than a second mode current threshold and time is greater than a second mode time threshold. In an example, the second mode fast passes when measured current is under a fast fail limit. Following testing in the second mode, the result may be output at operation 1250.

Figure 13:
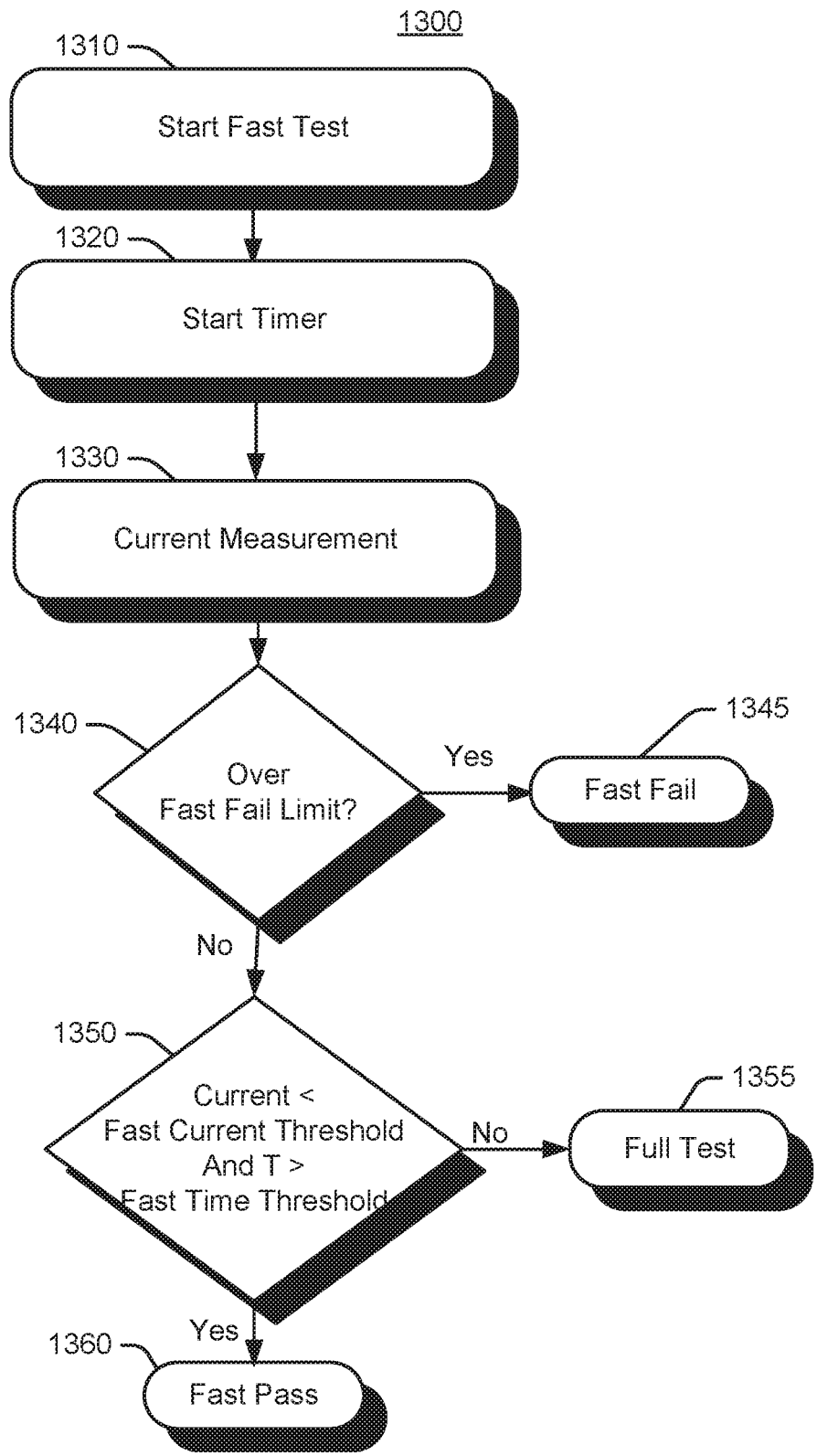
FIG. 13 is a flowchart illustrating example operations which may be implemented by an example electrical drain test device in a fast test mode.
Figure 14:
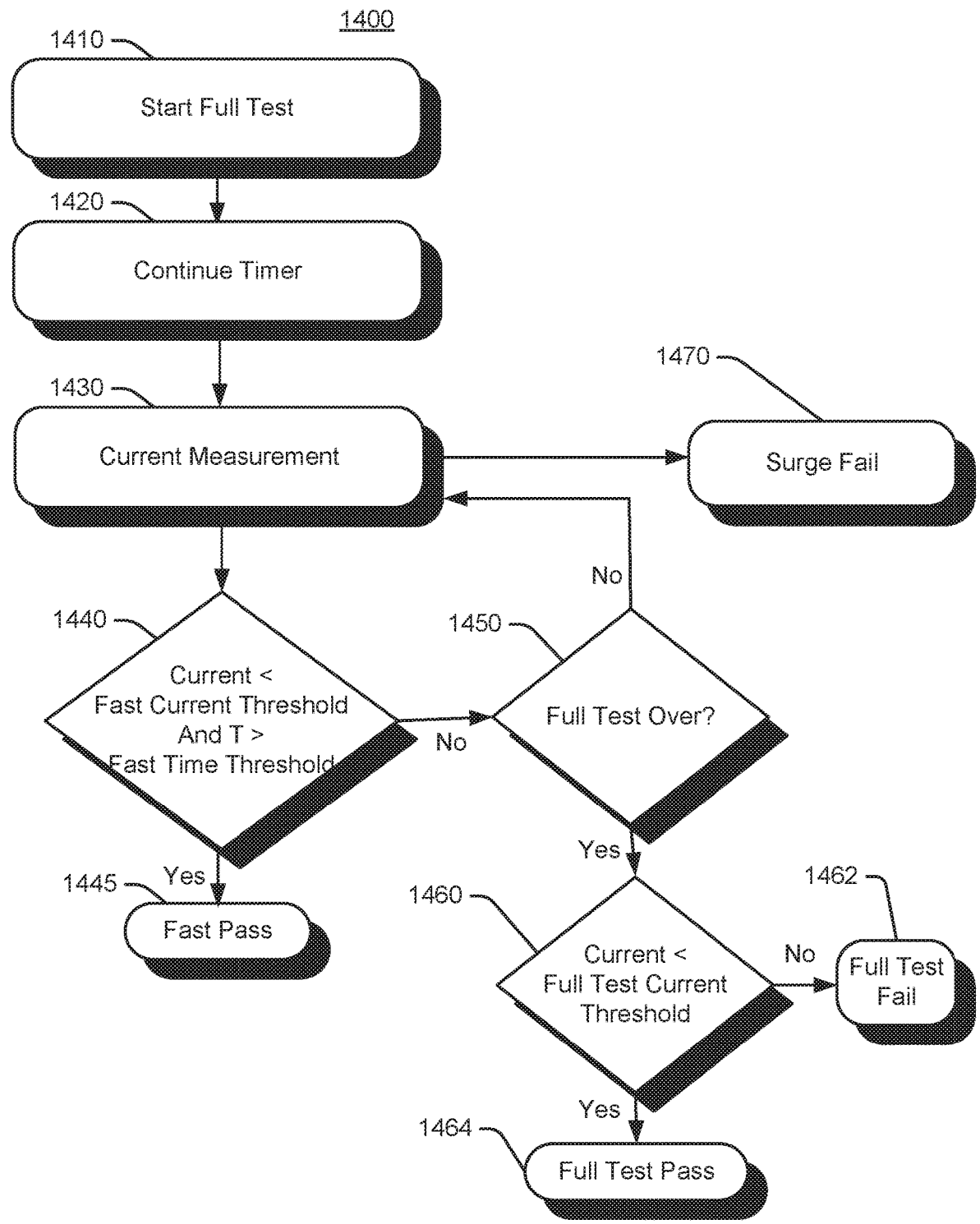
FIG. 14 is a flowchart illustrating example operations which may be implemented by an example electrical drain test device in a full test mode.

Examples of the first testing mode and the second testing mode are illustrated in FIGS. 13 and 14.

FIG. 13 is a flowchart illustrating example operations 1300 which may be implemented by an example electrical drain test device in a first or "fast" test mode. In an example, the components and connections depicted in the figures may be used.

Operation 1310 includes starting a fast test. Operation 1320 includes starting a timer. Operation 1330 includes measuring current for the electrical system under test.

It is noted that operations 1320 and 1330 are not discrete operations. Instead, these operations continue throughout the fast test. That is, the timer continues to run and the current measurement is continuous (or at least continues to take measurements at predetermined times during a sampling mode).

In an example, the time for testing in the first mode (the fast test) may be set in hardware (e.g., the circuitry shown in the drawings). In an example, the total testing time may be selected from the range of about 1 to 180 minutes; and in the first mode is one-half of that time. However, other times may also be selected, e.g., based on application.

A determination 1340 is made whether the measured current is over a fast fail limit (e.g., Current>Fast Fail Limit). It the current is over limit, the testing ends at 1345 with a "Fast Fail." It is noted that the test may end at any time the condition(s) for a fast fail are satisfied during testing in the first mode.

In an example, the fast fail test waits for a "dead time" (e.g., selected from the range of about 3 to 10 minutes, although other times are also contemplated). Following this dead time, a counter counts each time that the current is over a current limit (e.g., greater than or equal to about 2 amps) during a predetermined time (e.g., about 1 second). For example, if the current is measured to be 2 amps or higher for ten times in one second, this indicates a problem in the electrical circuitry exists and further testing is not necessary. when the number of fast fail counts count up to the number of tenth second periods in the fast fail time in minutes (typically 5 minutes), a fast fail occurs and may be issued by the output device.

It is noted that the fast fail feature only works during the first half of the test. By way of illustration, if the dead time is longer than half the test time, it will not trip. Therefore, if the sum of the dead time plus the fast fail time is longer than 50% of run time, the fast fail cannot trip.

If the test does not end with a fast fail, a determination 1350 is made whether current is less than a threshold (e.g., Current>Fast Current Threshold) and current measurement has continued for a threshold (e.g., T>Fast Time Threshold). If the condition(s) are satisfied, then testing ends and a "Fast Pass" is issued at operation 1360.

In an example, the fast pass is triggered if the current is below the low limit current (e.g., about 40 mA) for the low limit time (e.g., about 7 minutes). An example of the fast pass test uses the 20 sample average counter for current. It is noted, however, that other parameters may be implemented, e.g., based on application.

In an example, the fast fail test only operates in the first mode. However, a fast pass test (the same test or a separate test) may be operated in both the first mode and the second mode.

If the test does not result in either a fast fail or a fast pass, then operations continue with the full test at operation 1355. For example, testing may continue with a full test in a second mode, as illustrated in FIG. 14.

FIG. 14 is a flowchart illustrating example operations 1400 which may be implemented by an example electrical drain test device in a full test mode. In an example, the components and connections depicted in the figures may be used.

Operation 1410 includes starting a full test. Operation 1420 includes continuing the timer (e.g., from the first mode), although in another example the timer may be reset. Operation 1430 includes measuring current for the electrical system under test.

Again it is noted that operations 1420 and 1430 are not discrete operations. Instead, these operations continue throughout the fast test. That is, the timer continues to run and the current measurement is continuous (or at least continues to take measurements at predetermined times during a sampling mode).

A determination 1440 is made whether current is less than a threshold (e.g., Current>Fast Current Threshold) and current measurement has continued for a threshold (e.g., T>Fast Time Threshold). If the condition(s) are satisfied, then testing ends and a "Fast Pass" is issued at operation 1445.

As described in the example above, the fast pass may be triggered if the current is below the low limit current (e.g., about 40 mA) for the low limit time (e.g., about 7 minutes). An example of the fast pass test uses the 20 sample average counter for current. It is noted, however, that other parameters may be implemented, e.g., based on application.

If a fast pass is not triggered in operation 1440, then a determination 1450 may be made whether the full test is over. If the test is not over yet, then current measurements continue at operation 1430, and the fast pass may be triggered at operations 1440 to 1445.

When the full test is over, as determined at operation 1450, then a determination 1460 is made whether the measured current is less than a full test current threshold (e.g., Current<Full Test Current Threshold). If the condition is satisfied, then testing ends and a "Full Test Pass" is issued at operation 1462.

In an example, a long pass is triggered if the current is below the current high limit (e.g., about 50 mA) at the time the full test ends. In an example, the full test implements a 20 sample average current.

If the condition is not satisfied, then a "Full Test Fail" is issued at operation 1464. In an example, a long fail is triggered when the current is above the high current limit (e.g., about 50 mA) when the test ends. Again, an example test implements a 20 sample average current.

In an example, the testing may end at any time during operation in the first mode and/or second mode, if a surge fail condition is identified. A surge fail may be triggered by any of a variety of faults in the electrical system under test. For example, faults may include but are not limited to a short, a tripping breaker, a bad computer component, a defective node, a blown diode, and "pinging" modules.

In an example, the surge fail operation 1470 counts the number of times the average current is over a surge limit (e.g., greater than or equal to about 210 mA) using a 20 sample average counter. If the number of counts exceeds the number of tenth second periods in the surge time (e.g., greater than about 10 seconds), a surge fail is triggered. The surge counter is reset when transitioning to the second half test (e.g., about one-half of total test time). It is noted that other parameters may also be implemented to trigger a surge fail.

It is noted that the operations shown and described herein are provided to illustrate example implementations. It is noted that the operations are not limited to the ordering shown. Still other operations may also be implemented. In addition, various of the operations described herein may be automated or partially automated.

It is noted that the examples shown and described are provided for purposes of illustration and are not intended to be limiting. Still other examples are also contemplated.

The invention claimed is:

1. An electrical drain test device, comprising: a battery interface system having electrical cables to connect in-line with a negative battery post of a battery and an electrical system under test; a battery disconnect switch having a first position and a second position, the battery disconnect switch providing for continuous electrical current in the first position between the battery and the electrical system under test; a test circuit configured to test the electrical system under test for parasitic drain according to a connection sequence; and an output device to output a result of the test of the electrical system under test.

2. The device of claim 1, wherein the switch in the second position electrically connects the electrical system under test to the battery through the test circuit to test the electrical system under test for parasitic drain.

3. The device of claim 1, wherein the switch in the second position connects the electrical system under test to the test circuit without losing connectivity to test the electrical system under test without having to reset test or vehicle modules.

4. The device of claim 1, wherein the connection sequence comprises:
   a) disconnecting the negative battery post from an electrical system of a vehicle,
   b) connecting the test device to the negative battery post,
   c) connecting the test device to the system under test,
   d) switching on the system under test, shutting the system under test,
   e) switching the test device, and
   f) starting testing.

5. The device of claim 4, wherein switching on the system under test comprises starting the vehicle engine.

6. The device of claim 4, wherein switching on the system under test comprises operating the electrical system of the vehicle.

7. The device of claim 4, wherein switching on the system under test comprises driving the vehicle over a predetermined speed for a predetermined time.

8. The device of claim 4, wherein shutting the system under test comprises turning off an engine of the vehicle and removing a key from the vehicle.

9. The device of claim 8, wherein shutting the system under test comprises shutting all doors of the vehicle.

10. The device of claim 1, wherein the negative battery post is disconnected from the battery, and the test device is then connected to the electrical system under test and the battery via the battery disconnect switch.

11. The device of claim 10, wherein the battery disconnect switch is connected in series with the negative battery post of the battery.

12. The device of claim 11, wherein after the test device is connected and the electrical system is energized, the battery disconnect switch is moved to a second position so that the test device is ready for testing.

13. The device of claim 12, wherein after an initial connection, the system under test remains in electrical connection with the battery regardless of switch position.

14. An electrical drain test device, comprising: a battery interface system having electrical cables to connect in-line with a negative battery post of a battery and an electrical system under test without losing connectivity to test the electrical system under test without having to reset test or vehicle modules; a battery disconnect switch connected in series with the negative battery post of the battery, wherein the battery disconnect switch in a first position provides continuous electrical current between the battery and the electrical system, and in a second position electrically connects the electrical system under test to the battery through a test circuit to test the electrical system under test for parasitic drain, wherein after an initial connection, the system under test remains in electrical connection with the battery regardless of switch position; a test circuit configured to test the electrical system under test for parasitic drain according to a connection sequence; and an output device to output a result of the test of the electrical system under test.

15. The device of claim 14, wherein the negative battery post is disconnected from the battery, and the test device is then connected to the electrical system under test and the battery via the battery disconnect switch.

16. The device of claim 14, wherein after the test device is connected and the electrical system is energized, the battery disconnect switch is moved to a second position so that the test device is ready for testing.

17. The device of claim 14, wherein the connection sequence comprises: a) disconnecting the negative battery post from an electrical load, b) connecting the test device to the negative battery post, c) connecting the test device to the system under test, d) switching on the system under test, shutting the system under test, e) switching on the test device, and f) starting testing.

18. A electrical drain test method, comprising: connecting electrical cables of a battery interface system in-line with a negative battery post of a battery and an electrical system under test; providing a test device with a battery disconnect switch for continuous provision of electrical current in a first position between the battery and the electrical system, and in a second position between the electrical system to the battery through the test device; testing the electrical system under test for parasitic drain according to a connection sequence; and outputting a result of the test of the electrical system.

19. The method of claim 18, wherein the battery disconnect switch electrically connects the battery and the electrical system in the first position, and the battery disconnect switch electrically connects the electrical system under test to the battery through a test circuit to test the electrical system under test for parasitic drain in the second position where the electrical system under test is connected without losing connectivity to test the electrical system under test without having to reset test or vehicle modules.

20. The method of claim 18, wherein the connection sequence comprises:
   a) disconnecting the negative battery post,
   b) connecting the test device to the negative battery post
   c) connecting the test device to the system under test,
   d) switching on the system under test, shutting the system under test,
   e) switching on the test device, and
   f) starting testing.

* * * * *